(12) United States Patent
Kim et al.

(10) Patent No.: US 11,600,350 B2
(45) Date of Patent: Mar. 7, 2023

(54) METHODS OF TESTING NONVOLATILE MEMORY DEVICES

(71) Applicant: SAMSUNG ELECTRONICS CO., LTD., Suwon-si (KR)

(72) Inventors: Seungbum Kim, Hwaseong-si (KR); Kyoman Kang, Gunpo-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/509,678

(22) Filed: Oct. 25, 2021

(65) Prior Publication Data

US 2022/0366993 A1 Nov. 17, 2022

(30) Foreign Application Priority Data

May 11, 2021 (KR) .................. 10-2021-0060475

(51) Int. Cl.
| | | |
|---|---|---|
| G11C 29/14 | (2006.01) |
| G11C 29/12 | (2006.01) |
| G11C 29/46 | (2006.01) |
| G11C 7/06 | (2006.01) |
| G11C 7/10 | (2006.01) |

(52) U.S. Cl.
CPC .............. G11C 29/14 (2013.01); G11C 7/06 (2013.01); G11C 7/1012 (2013.01); G11C 7/1048 (2013.01); G11C 29/12005 (2013.01); G11C 29/46 (2013.01); *G11C 2029/1202* (2013.01); *G11C 2029/1204* (2013.01)

(58) Field of Classification Search
CPC ......... G11C 29/14; G11C 7/06; G11C 7/1012; G11C 7/1048; G11C 29/12005; G11C 29/46
See application file for complete search history.

(56) References Cited

U.S. PATENT DOCUMENTS

| | | |
|---|---|---|
| 7,400,533 B2 | 7/2008 | Roohparvar |
| 7,660,174 B2 | 2/2010 | Han et al. |
| 7,687,921 B2 | 3/2010 | Hiew et al. |
| 8,669,778 B1 | 3/2014 | Or-Bach et al. |

(Continued)

FOREIGN PATENT DOCUMENTS

| | | |
|---|---|---|
| KR | 20070048390 A | 5/2007 |
| KR | 896463 A | 5/2009 |
| KR | 20210015283 A | 2/2021 |

*Primary Examiner* — Han Yang
(74) *Attorney, Agent, or Firm* — Volentine, Whitt & Francos, PLLC

(57) ABSTRACT

In a method of testing a nonvolatile memory device including a first semiconductor layer in which and a second semiconductor layer is formed prior to the first semiconductor layer, circuit elements including a page buffer circuit are provided in the second semiconductor layer, an on state of nonvolatile memory cells which are not connected to the page buffer circuit is mimicked by providing a conducting path between an internal node of a bit-line connection circuit connected between a sensing node and a bit-line node of the page buffer circuit and a voltage terminal to receive a first voltage, a sensing and latching operation with the on state being mimicked is performed in the page buffer circuit and a determination is made as to whether the page buffer circuit operates normally is made based on a result of the sensing and latching operation.

20 Claims, 23 Drawing Sheets

(56) References Cited

U.S. PATENT DOCUMENTS

| | | |
|---|---|---|
| 9,230,677 B2 | 1/2016 | Lee |
| 10,825,531 B1 | 11/2020 | Park et al. |
| 11,217,326 B2 * | 1/2022 | Choi ..................... G11C 16/10 |

* cited by examiner

| CONNECT THE INTERNAL NODE TO A GROUND VOLTAGE DURING A FIRST TIME INTERVAL | —S237 |

| CONNECT THE INTERNAL NODE TO A SECOND VOLTAGE GREATER THAN A GROUND VOLTAGE DURING A FIRST TIME INTERVAL | —S239 |

METHODS OF TESTING NONVOLATILE MEMORY DEVICES

CROSS-REFERENCE TO RELATED APPLICATIONS

This US application claims the benefit of priority under 35 USC § 119 to Korean Patent Application No. 10-2021-0060475, filed on May 11, 2021 in the Korean Intellectual Property Office, the disclosure of which is hereby incorporated by reference in its entirety.

BACKGROUND

1. Technical Field

Example embodiments generally relate to semiconductor memory devices, and more particularly to methods of testing nonvolatile memory devices.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various devices, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration and memory capacity of the nonvolatile memory devices. In the nonvolatile memory devices of a three-dimensional structure, a peripheral circuit and a memory cell array are sequentially or individually manufactured, and the peripheral circuit needs to be tested in various environments with the memory cell array being stacked on the peripheral circuit.

SUMMARY

Some exemplary embodiments may provide a method of testing a non-volatile memory device, capable of performing an on-cell test with the memory cells not being connected to a peripheral circuit.

Some exemplary embodiments may provide a method of testing a non-volatile memory device, capable of performing an on-cell test with the connection of memory cells to a peripheral circuit being cutting off.

According to some exemplary embodiments, in a method of testing a non-volatile memory device including a first semiconductor layer and a second semiconductor layer, wherein a plurality of nonvolatile memory cells, a plurality of word-lines and a plurality of bit-lines are provided in the first semiconductor layer and the second semiconductor layer is formed prior to the first semiconductor layer, circuit elements including a page buffer circuit are provided in the second semiconductor layer by forming semiconductor elements and patterns for wiring the semiconductor elements in the second semiconductor layer, on state of nonvolatile memory cells which are not connected to the page buffer circuit are mimicked by providing a conducting path between an internal node of a bit-line connection circuit connected between a sensing node and a bit-line node of the page buffer circuit and a voltage terminal to receive a first voltage, a sensing and latching operation with the on state being mimicked, is performed in the page buffer circuit and whether the page buffer circuit operates normally, is determined based on a result of the sensing and latching operation.

According to some exemplary embodiments, in a method of testing a non-volatile memory device including a first chip and a second chip, wherein the first chip includes a memory cell region and is provided on a first wafer and the second chip includes a peripheral circuit region having a page buffer circuit and is provided on a second wafer different from the first wafer, circuit elements including the page buffer circuit are provided by forming semiconductor elements and patterns for wiring the semiconductor elements in a first substrate on the second wafer, on state of nonvolatile memory cells which are not connected to the page buffer circuit are mimicked by providing a conducting path between an internal node of a bit-line connection circuit connected between a sensing node and a bit-line node of the page buffer circuit and a voltage terminal to receive a first voltage, a sensing and latching operation with the on state being mimicked is performed in the page buffer circuit and whether the page buffer circuit operates normally is determined based on a result of the sensing and latching operation.

According to some exemplary embodiments, in a method of testing a non-volatile memory device including a memory cell array and a page buffer circuit coupled to the memory cell array through a plurality of bit-lines, wherein the memory cell array includes a plurality of nonvolatile memory cells, a string selection transistor of at least one NAND string is turned-off with the least one NAND string being connected to the page buffer circuit through at least one bit-line of the plurality of bit-lines, a conducting path is provided between an internal node of a bit-line connection circuit connected between a sensing node and a bit-line node coupled to the at least one bit-line of the page buffer circuit and a voltage terminal to receive a first voltage, a sensing and latching operation with the on state being mimicked is performed in the page buffer circuit and whether the page buffer circuit operates normally is determined based on a result of the sensing and latching operation.

Accordingly, a test is performed on a page buffer circuit, which is formed from individual memory cells or prior to the memory cells being coupled to the page buffer circuit by mimicking on-state of the memory cells. Therefore, a test is performed on various test items under an off-cell environment and on-cell environment with the memory cells being uncoupled, and thus test coverage may be enhanced on a nonvolatile memory device.

BRIEF DESCRIPTION OF THE DRAWINGS

Illustrative, non-limiting exemplary embodiments will be more clearly understood from the following detailed description in conjunction with the accompanying drawings.

FIG. 4 illustrates an exemplary operation of connecting the internal node to the voltage terminal in FIG. 3 according to exemplary embodiments.

FIG. 5 illustrates an exemplary operation of connecting the internal node to the voltage terminal in FIG. 3 according to exemplary embodiments.

DETAILED DESCRIPTION OF THE EMBODIMENTS

Various exemplary embodiments will be described more fully hereinafter with reference to the accompanying drawings, in which some exemplary embodiments are shown.

Figure 1:
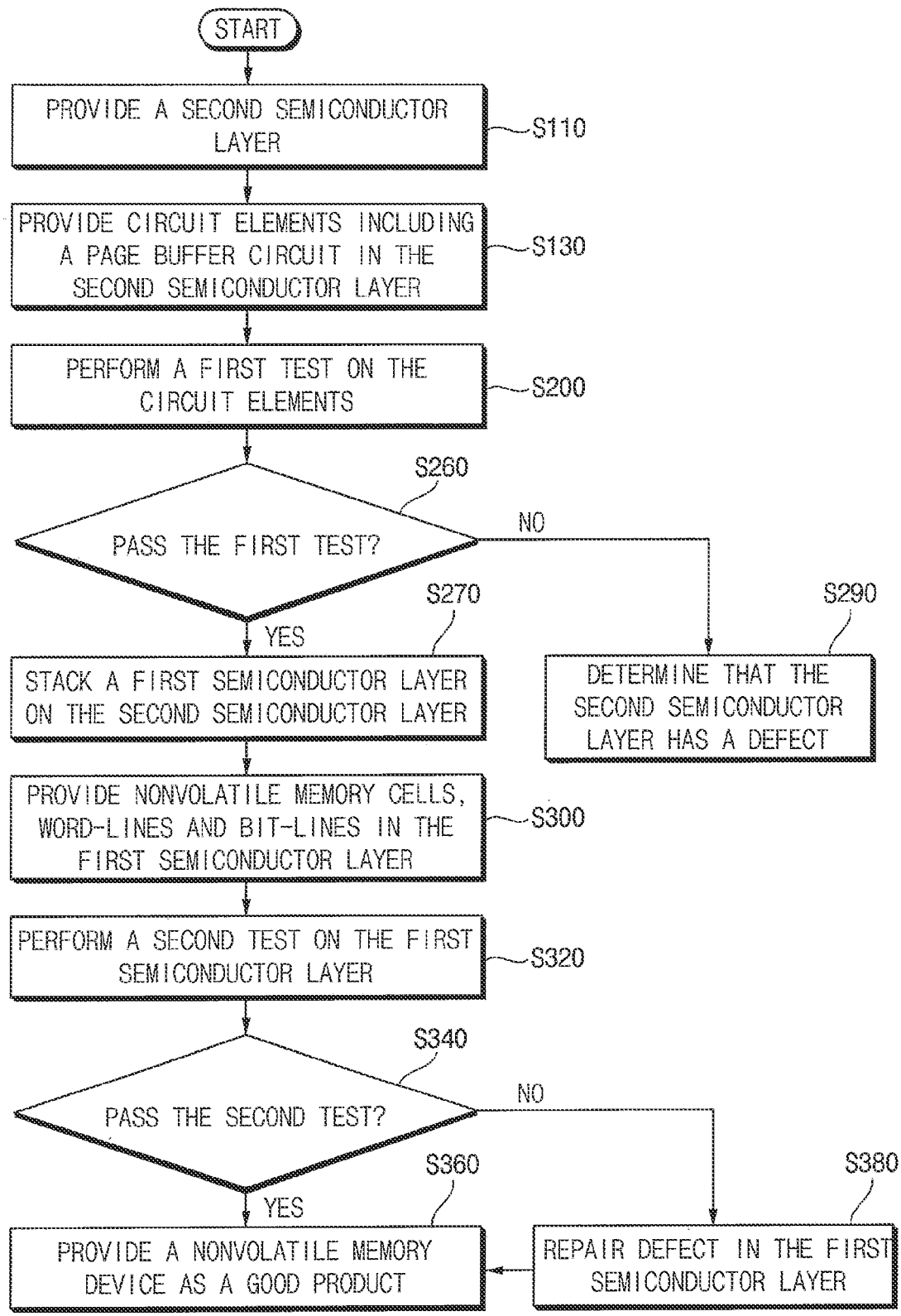
FIG. 1 is a flow chart illustrating a method of manufacturing a nonvolatile memory device according to exemplary embodiments.

FIG. 1 is a flow chart illustrating a method of manufacturing a nonvolatile memory device according to exemplary embodiments.

For convenience of explanation, a method of manufacturing a nonvolatile memory device will be explained with reference to FIGS. 1, 6 and 8.

Figure 6:
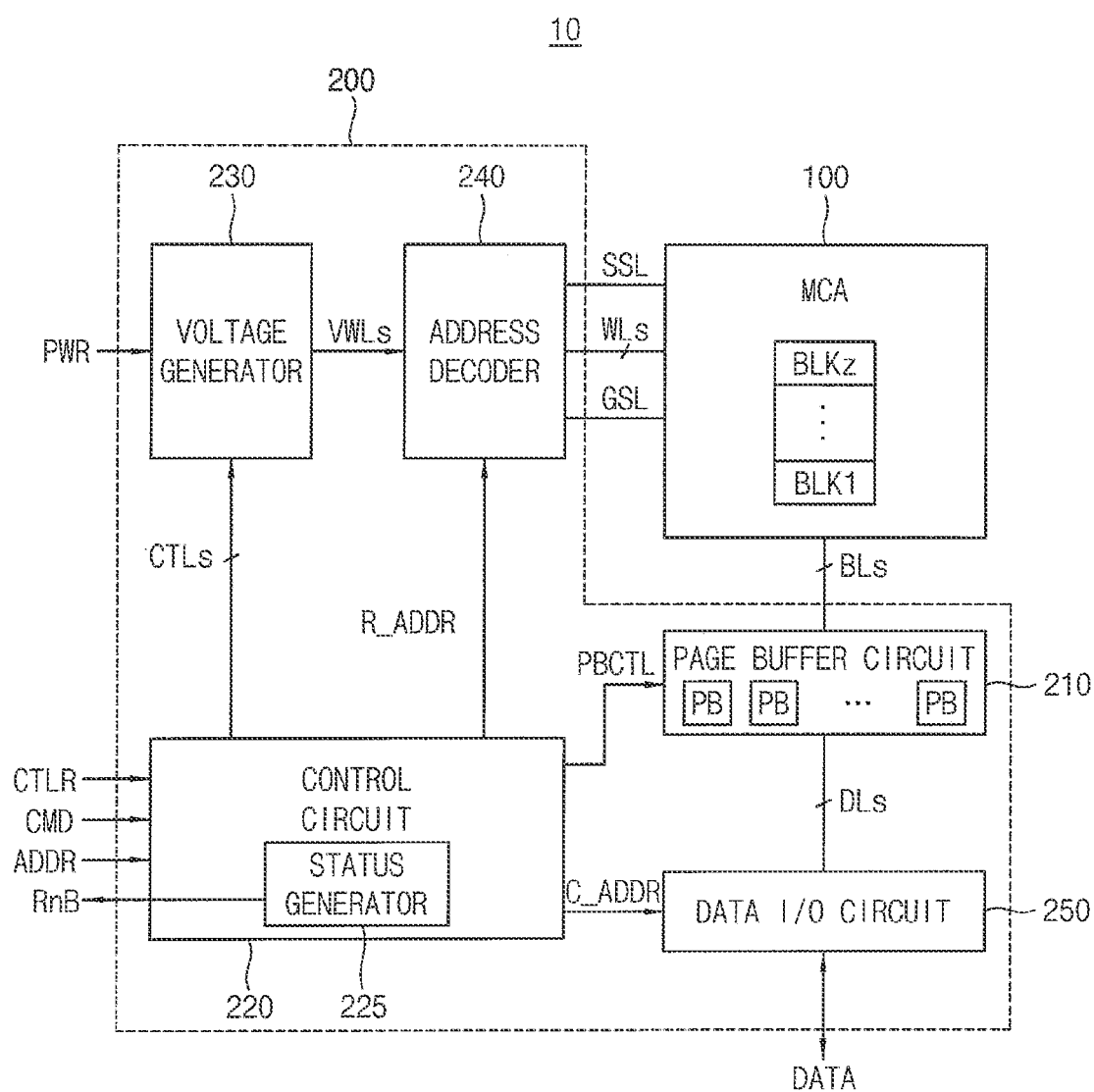
FIG. 6 is a block diagram of a nonvolatile memory device according to exemplary embodiments.
Figure 8:
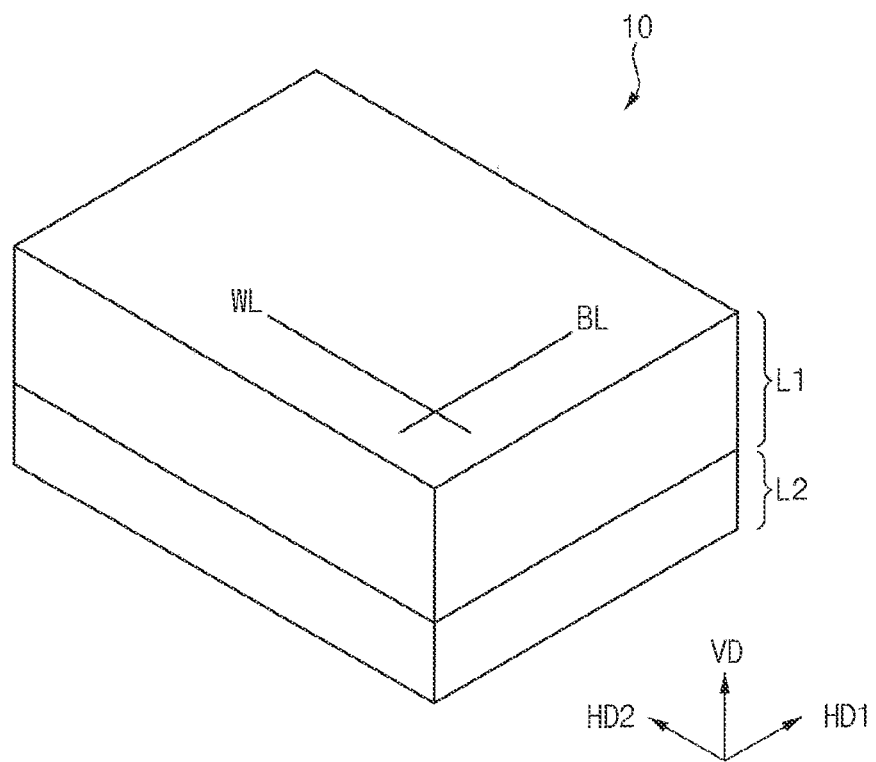
FIG. 8 schematically illustrates a structure of the non-volatile memory device of FIG. 6 according to exemplary embodiments.

Referring to FIGS. 1, 6 and 8, there is provided a method of manufacturing a nonvolatile memory device 10 including a first semiconductor layer L1 and a second semiconductor layer L2. A plurality of nonvolatile memory cells, a plurality of word-lines WLs and a plurality of bit-lines BLs are provided in the first semiconductor layer L1 and the second semiconductor layer L2 is formed prior to the first semiconductor layer L1.

According to the method, the second semiconductor layer L2 is provided (operation S110).

Circuit elements including a page buffer circuit 210 are provided in the second semiconductor layer L2 by forming semiconductor elements and patterns for wiring the semiconductor elements on a bottom substrate of the second semiconductor layer L2 (operation S130). A first test is performed on the circuit elements (operation S200).

If it is determined that the second semiconductor layer L2 passes the first test based on a result of the first test (operation S260). Then when the second semiconductor layer L2 does not pass the first test (NO in operation S260), the second semiconductor layer L2 is determined to have a defect (operation S290).

When the second semiconductor layer L2 passes the first test (YES in operation S260), the first semiconductor layer L1 is stacked on the second semiconductor layer L2 (operation S270).

A plurality of nonvolatile memory cells, a plurality of word-lines WLs and a plurality of bit-lines BLs are provided in the first semiconductor layer L1 (operation S300). At least some of the plurality of word-lines WLs and the plurality of bit-lines BL are connected to the circuit elements in the second semiconductor layer L2 after the plurality of nonvolatile memory cells, the plurality of word-lines WLs and the plurality of bit-lines BLs are provided in the first semiconductor layer L1.

A second test is performed on the plurality of nonvolatile memory cells, the plurality of word-lines WLs and the plurality of bit-lines BL (operation S320).

If it is determined that the first semiconductor layer L1 passes the second test based on a result of the second test (operation S340). Then when the first semiconductor layer L1 passes the second test (YES in operation S340), the nonvolatile memory device 10 is deemed a good product (operation S360). When the first semiconductor layer L1 does not pass the second test (NO in operation S340), a defect of the nonvolatile memory device 10 is repaired (operation S380) and the nonvolatile memory device 10 is provided then deemed a good product (operation S360).

Figure 2:
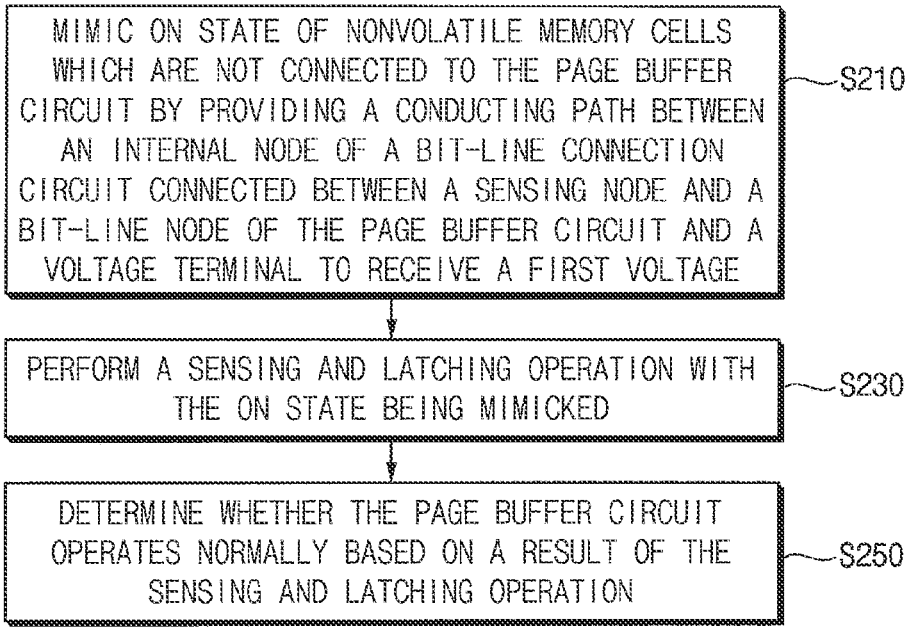
FIG. 2 is a flow chart illustrating operations of a first test on the circuit elements in FIG. 1 according to exemplary embodiments.

FIG. 2 is a flow chart illustrating operations of a first test on the circuit elements in FIG. 1 according to exemplary embodiments.

For convenience of explanation, operations of the first test will be explained with reference to FIGS. 2, 6 and 12.

Figure 12:
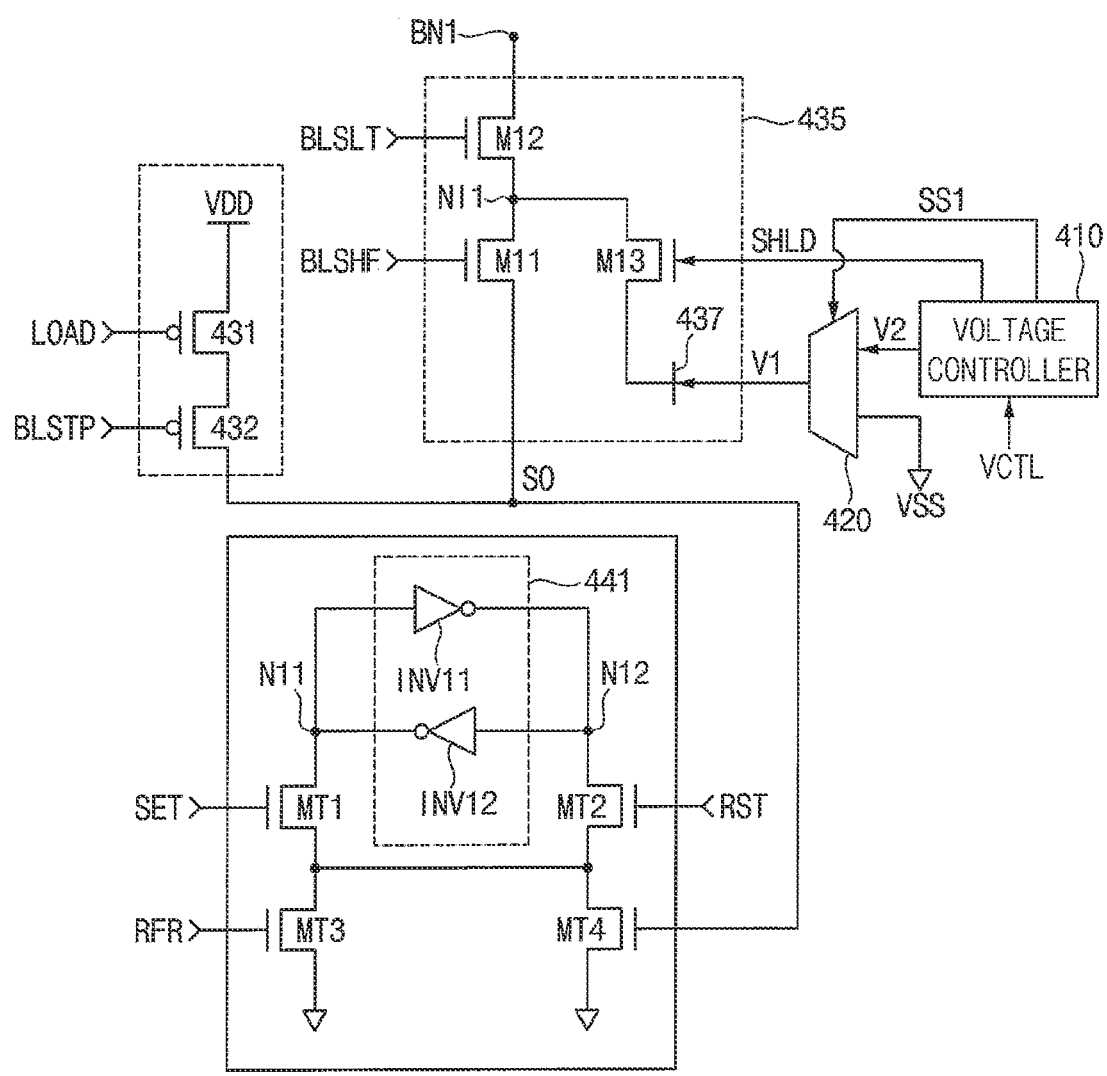
FIG. 12 is a circuit diagram illustrating one of page buffers in the page buffer circuit in FIG. 6 according to exemplary embodiments.

Referring to FIGS. 2, 6 and 12, for performing the first test on the circuit elements (operation S200), an on state of memory cells which are not connected to the page buffer circuit 210 is mimicked by providing a conducting path between an internal node NI1 of a bit-line connection circuit 435 and a voltage terminal 437 to receive a first voltage V1 (operation S210). The bit-line connection circuit 435 is connected between a sensing node SO and a bit-line node BN1 of the page buffer circuit 210 (or a page buffer PBa).

A sensing and latching operation is performed in the page buffer circuit 210, with the on state being mimicked (operation S230). If it determined that the page buffer circuit 210 operates normally based on a result of the sensing and latching operation (operation S250).

It is determined that each of other circuit elements operates normally after determining that the page buffer circuit 210 operates normally.

Figure 3:
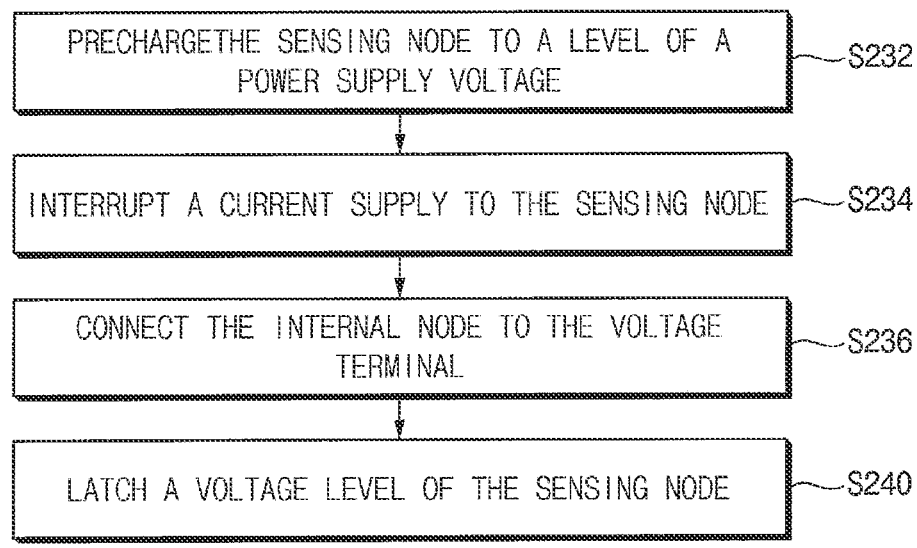
FIG. 3 is a flow chart illustrating detailed operations for performing a sensing and latching operation in FIG. 2 according to exemplary embodiments.

FIG. 3 is a flow chart illustrating detailed operations of performing a sensing and latching operation in FIG. 2 according to exemplary embodiments.

For convenience of explanation, operations for the performing the sensing and latching operations will be explained with reference to FIGS. 3 and 12.

Referring to FIGS. 3 and 12, for performing the sensing and latching operation (S230), the sensing node SO is pre-charged to a level of a power supply voltage VDD (operation S232). A current supply to the sensing node SO is interrupted (operation S234). The internal node NI1 is connected to the voltage terminal 437 receiving the first voltage V1 (operation S236) such that on-cells are coupled to the bit-line node BN1. The first voltage V1 may correspond to one of a ground voltage VSS and a second voltage V2 greater than the ground voltage VSS. The second voltage V2 may be about 1.0[V]. When the internal node NI1 is connected to the voltage terminal 437, a conducting path may be provided between the internal node NH and the voltage terminal 437.

FIG. 4 illustrates an exemplary operation of connecting the internal node to the voltage terminal in FIG. 3 according to exemplary embodiments.

For convenience of explanation, FIG. 4 will be explained with reference to FIG. 12.

Referring to FIGS. 4 and 12, for connecting the internal node to the voltage terminal (operation S236a), the internal node NI1 is connected to the ground voltage VSS during a first time interval (operation S237).

FIG. 5 illustrates an exemplary operation of connecting the internal node to the voltage terminal in FIG. 3 according to exemplary embodiments.

For convenience of explanation, FIG. 5 will be explained with reference to FIG. 12.

Referring to FIGS. 5 and 12, for connecting the internal node to the voltage terminal (operation S236b), the internal node NH is connected to the second voltage V2 greater than the ground voltage VSS during a first time interval (operation S239).

A testing method with reference to FIGS. 2 through 5 may be concurrently performed on a plurality of second semiconductors on a wafer.

FIG. 6 is a block diagram of a nonvolatile memory device according to exemplary embodiments.

Referring to FIG. 6, a nonvolatile memory device 10 may include a memory cell array 100 and a peripheral circuit 200. The peripheral circuit 200 may include a page buffer circuit 210, a control circuit 220, a voltage generator 230, an address decoder 240, and a data input/output (I/O) circuit 250. Although not illustrated in FIG. 6, the peripheral circuit 200 may further include an I/O interface, a column logic, a pre-decoder, a temperature sensor, a command decoder, etc.

The memory cell array 100 may be coupled to the address decoder 240 through a string selection line SSL, a plurality of word-lines WLs, and a ground selection line GSL. In addition, the memory cell array 100 may be coupled to the page buffer circuit 210 through a plurality of bit-lines BLs. The memory cell array 100 may include a plurality of nonvolatile memory cells coupled to the plurality of word-lines WLs and the plurality of bit-lines BLs.

The memory cell array 100 may include a plurality of memory blocks BLK1 through BLKz, and each of the memory blocks BLK1 through BLKz may have a three-dimensional (3D) structure. The memory cell array 100 may include a plurality of vertical cell strings and each of the vertical cell strings includes a plurality of memory cells stacked with respect to each other.

The control circuit 220 may, receive a command CMD, an address ADDR, and a control signal CTRL from a memory controller (20 in FIG. 7) and may control an erase loop, a program loop and a read operation of the nonvolatile memory device 10.

In other exemplary embodiments, the control circuit 220 may generate control signals CTLs, which are used for controlling the voltage generator 230, based on the command CMD, may generate a page buffer control signal PBCTL for controlling the page buffer circuit 210 and generate a row address R_ADDR and a column address C_ADDR based on the address ADDR. The control circuit 220 may provide the control signals CTLs to the voltage generator 230 and may provide the page buffer control signal PBCTL to the page buffer circuit 210. In addition, the control circuit 220 may provide the row address R_ADDR to the address decoder 240 and provide the column address C_ADDR to the data I/O circuit 250. The control circuit 220 may include a status generator 225 and the status generator 225 may generate a status signal RnB indicating an operating status of the nonvolatile memory device 10. The status signal RnB may be referred to as a ready/busy signal because of the status signal RnB indicates either busy state or a ready state of the nonvolatile memory device 10.

The address decoder 240 may be coupled to the memory cell array 100 through the string selection line SSL, the plurality of word-lines WLs, and the ground selection line GSL. During program operation or read operation, the address decoder 240 may select one of the plurality of word-lines WLs as a selected word-line based on the row address R_ADDR and may determine the remainder of the plurality of word-lines WLs except the selected word-line as unselected word-lines.

The voltage generator 230 may generate word-line voltages VWLs associated with operations of the nonvolatile memory device 10 using power PWR provided from the memory controller 20 based on control signals CTLs from the control circuit 220. The word-line voltages VWLs may include a program voltage, a read voltage, a pass voltage, an erase verification voltage, or a program verification voltage. The word-line voltages VWLs may be applied to the plurality of word-lines WLs through the address decoder 240.

For example, during the erase operation, the voltage generator 230 may apply an erase voltage to a well of a selected memory block and may apply a ground voltage to all word-lines of the selected memory block. During the erase verification operation, the voltage generator 230 may apply an erase verification voltage to all word-lines of the selected memory block or may apply the erase verification voltage to the word-lines of the selected memory block on a word-line basis.

For example, during the program operation, the voltage generator 230 may apply a program voltage to the selected word-line and may apply a program pass voltage to the unselected word-lines. In addition, during the program verification operation, the voltage generator 230 may apply a program verification voltage to the selected word-line and may apply a verification pass voltage to the unselected word-lines. In addition, during the read operation, the voltage generator 230 may apply a read voltage to the selected word-line and may apply a read pass voltage to the unselected word-lines.

The page buffer circuit 210 may be coupled to the memory cell array 100 through the plurality of bit-lines BLs. The page buffer circuit1 410 may include a plurality of page buffers PB. The page buffer circuit 210 may temporarily store data to be programmed in a selected page or data read out from the selected page of the memory cell array 100.

Figure 14:
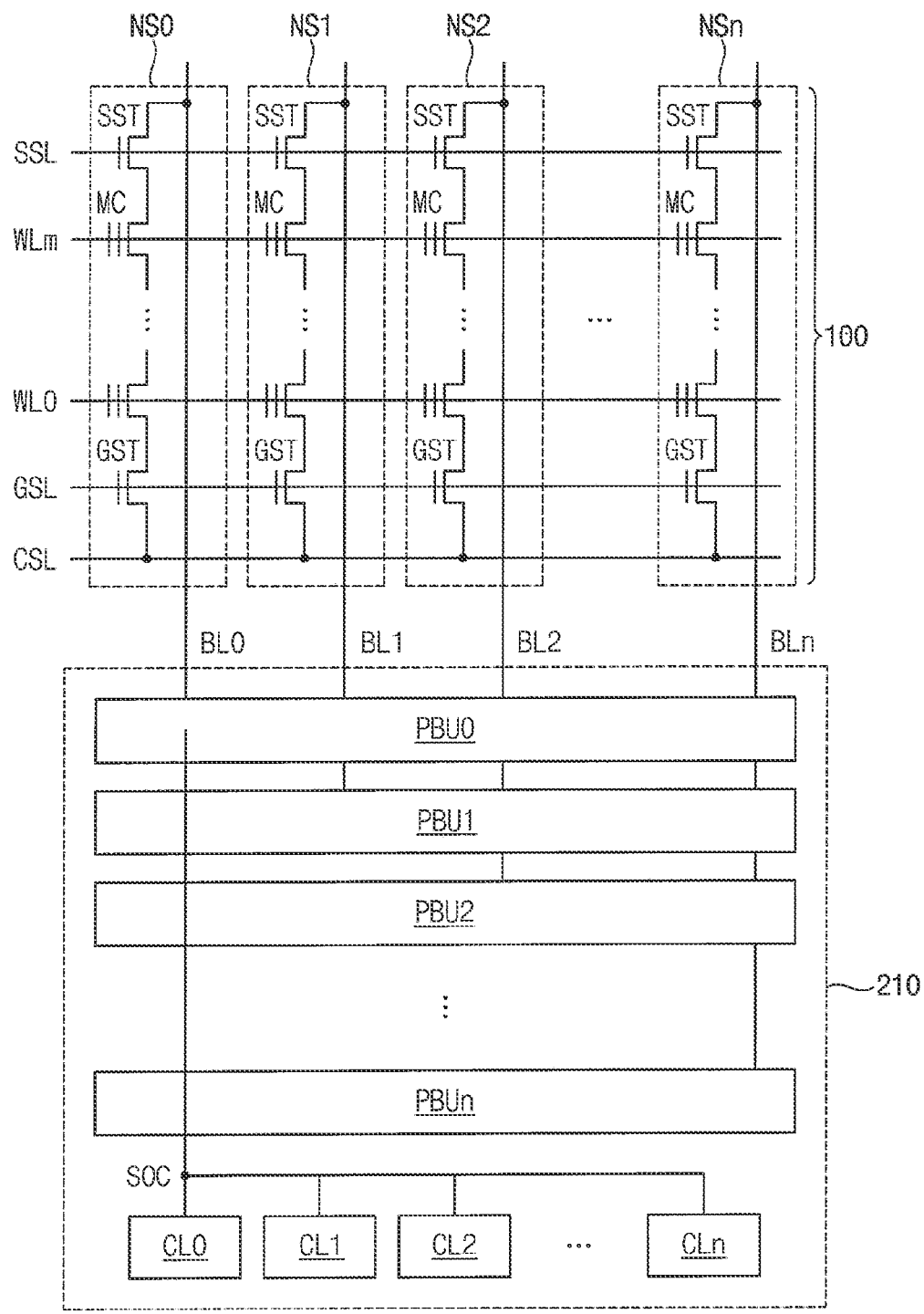
FIG. 14 is a schematic diagram of a connection of the memory cell array to the page buffer circuit in FIG. 6, according to exemplary embodiments.

In exemplary embodiments, page buffer units included in each of the plurality of page buffers PB (for example, first through (n+1)th page buffer units PBU0 through PBUn in FIG. 14) and cache latches included in each of the plurality of page buffers PB (for example, first through (n+1)th cache latches CL0 through CLn in FIG. 14) may be apart from each other, and have separate structures. Accordingly, the degree of freedom of wirings on page buffer units may be improved, and the complexity of a layout may be reduced. In addition, because the cache latches are adjacent to the data I/O lines, the distance between the cache latches and the data I/O lines may be reduced, and thus, data I/O speed may be improved.

The data I/O circuit 250 may be coupled to page buffer circuit 210 through data lines DLs. During the program operation, the data I/O circuit 420 may receive program data DATA from the memory controller (20 in FIG. 7) and provide the program data DATA to the page buffer circuit 210 based on the column address C_ADDR received from the control circuit 220. During the read operation, the data I/O circuit 250 may provide read data DATA to the memory controller 20 based on the column address C_ADDR received from the control circuit 220.

The manufacturing and testing method described with reference to FIGS. 1 through 5 may be applied to the nonvolatile memory device 10 of FIG. 6. The peripheral circuit 200 is provided in the second semiconductor layer (L2 in FIG. 8) and the memory cell array 100 is stacked on the semiconductor layer (L2 in FIG. 8) after the second semiconductor layer (L2 in FIG. 8) passes the first test.

In addition, when the first test is performed on peripheral circuit 200 with the memory cell array 100 being unconnected to the peripheral circuit 200, a result of the first test may be provided to an external test device.

Figure 7:
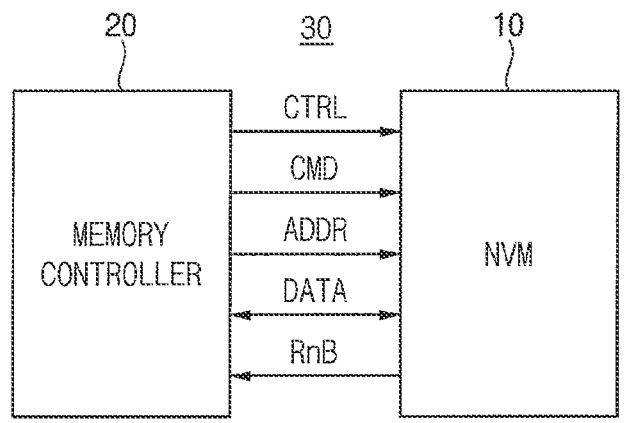
FIG. 7 is a block diagram illustrating a memory system including the non-volatile memory device of FIG. 6 according to exemplary embodiments.

FIG. 7 is a block diagram illustrating a memory system including the non-volatile memory device of FIG. 6 according to exemplary embodiments.

Referring to FIG. 7, a memory system 30 may include a memory controller 20 and the nonvolatile memory device 10.

The memory controller 20 may control operation of the nonvolatile memory device 10 by applying control signal CTRL, the command CMD and address ADDR to the nonvolatile memory device 10 may exchange the data DATA with the nonvolatile memory device 10. The non-volatile memory device 10 may provide the status signal RnB indicating operating status of the nonvolatile memory device 10. For example, when the status signal RnB has a logic high level (on state), the status signal RnB indicates that the non-volatile memory device 10 is ready for receiving a command from the memory controller 40.

FIG. 8 schematically illustrates a structure of the non-volatile memory device of FIG. 6 according to exemplary embodiments.

Referring to FIG. 8, the nonvolatile memory device 10 may include a first semiconductor layer L1 and a second semiconductor layer L2, and the first semiconductor layer L1 may be stacked in a vertical direction VD with respect to the second semiconductor layer L2. The second semiconductor layer L2 may be under the first semiconductor layer L1 in the vertical direction VD, and accordingly, the second semiconductor layer L2 may be close to a substrate.

In exemplary embodiments, the memory cell array 100 in FIG. 6 may be formed (or, provided) on the first semiconductor layer L1, and the peripheral circuit 200 in FIG. 6 may be formed (or, provided) on the second semiconductor layer L2. Accordingly, the nonvolatile memory device 10 may have a structure in which the memory cell array 100 is on the peripheral circuit 200, that is, a cell over periphery (COP) structure. The COP structure may effectively reduce an area in a horizontal direction and improve the degree of integration of the nonvolatile memory device 10.

In exemplary embodiments, the second semiconductor layer L2 may include the substrate, and by forming transistors on the substrate and metal patterns for wiring transistors, the peripheral circuit 200 may be formed in the second semiconductor layer L2. After the peripheral circuit 200 is formed on the second semiconductor layer L2, the first semiconductor layer L1 including the memory cell array 100 may be formed, and the metal patterns for connecting the word-lines WL and the bit-lines BL of the memory cell array 100 to the peripheral circuit 200 formed in the second semiconductor layer L2 may be formed. For example, the bit-lines BL may extend in a first horizontal direction HD1, and the word-lines WL may extend in a second horizontal direction HD2.

As the number of stages of memory cells in the memory cell array 100 increases with the development of semiconductor processes, that is, as the number of stacked word-lines WL increases, an area of the memory cell array 100 may decrease, and accordingly, an area of the peripheral circuit 200 may also be reduced. According to an embodiment, to reduce an area of a region occupied by the page buffer circuit 210, the page buffer circuit 210 may have a structure in which the page buffer unit and the cache latch are separated from each other, and may connect sensing nodes included in each of the page buffer units in a combined sensing node. This will be explained in detail with reference to FIG. 14.

Figure 9:
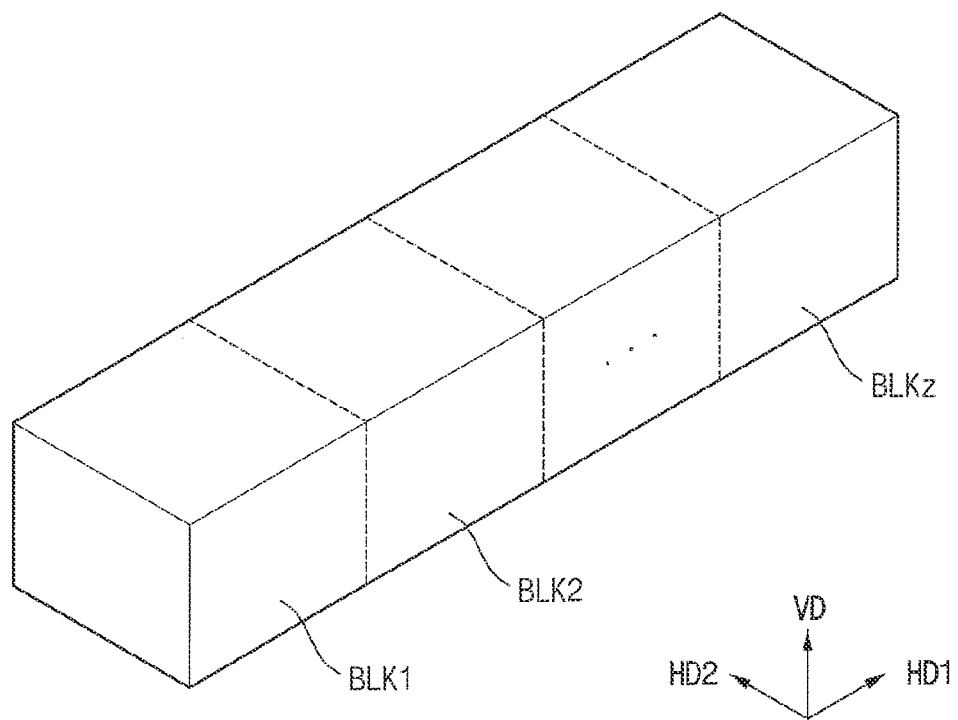
FIG. 9 is a block diagram illustrating an example of the memory cell array in FIG. 6 according to exemplary embodiments.

FIG. 9 is a block diagram illustrating an example of the memory cell array in FIG. 6 according to exemplary embodiments.

Referring to FIG. 9, the memory cell array 100 may include a plurality of memory blocks BLK1 to BLKz which extend along a plurality of directions HD1, HD2 and VD. In an embodiment, the memory blocks BLK1 to BLKz are selected by the address decoder 240 in FIG. 6. For example, the address decoder 240 may select a memory block BLK corresponding to a block address among the memory blocks BLK1 to BLKz.

Figure 10:
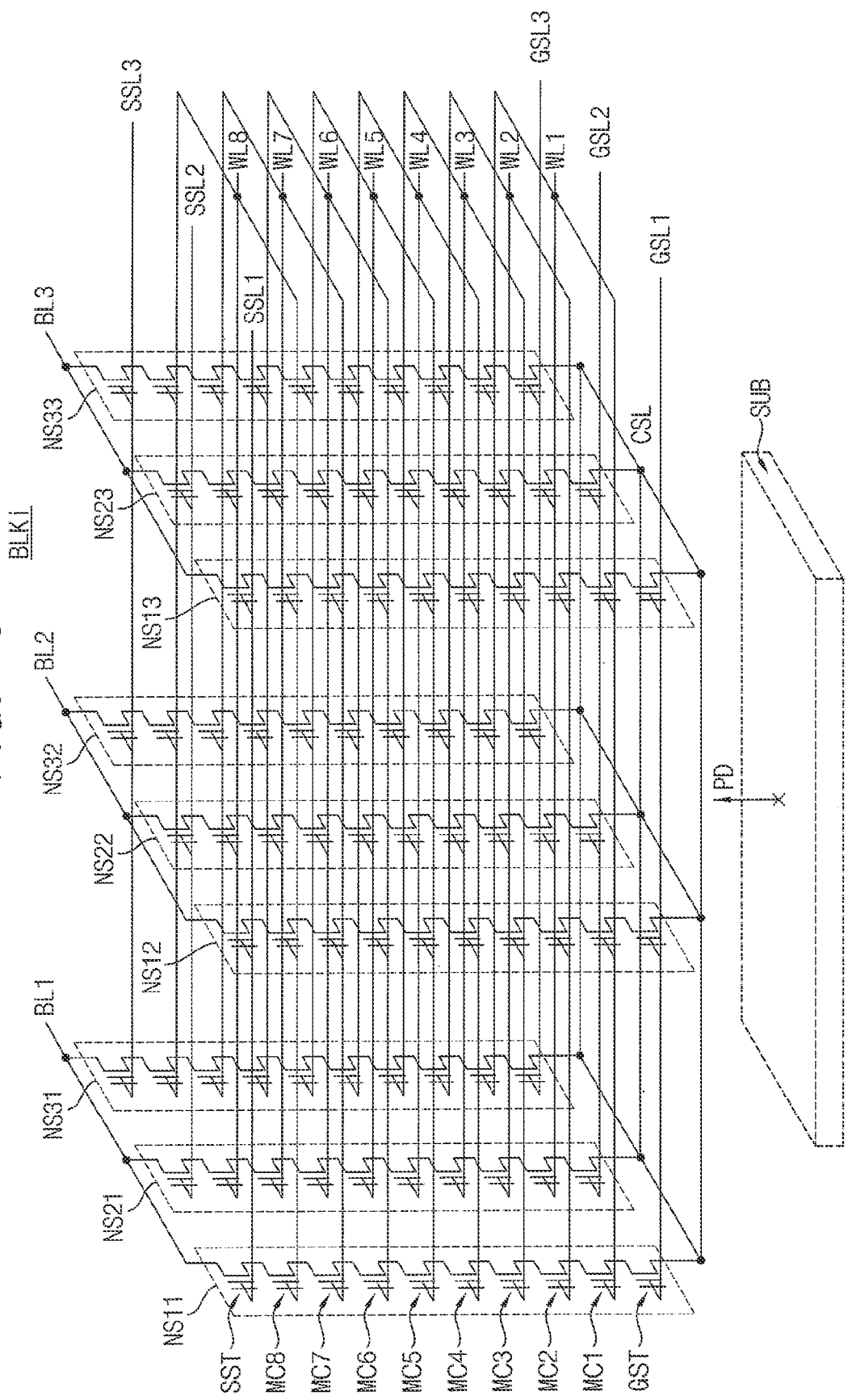
FIG. 10 is a circuit diagram illustrating one of the memory blocks of FIG. 9.

FIG. 10 is a circuit diagram illustrating one of the memory blocks of FIG. 9.

The memory block BLKi of FIG. 10 may be formed on a substrate SUB in a three-dimensional structure (or a vertical structure). For example, a plurality of memory cell strings included in the memory block BLKi may be formed in a direction PD perpendicular to the substrate SUB.

Referring to FIG. 10, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 10, each of the memory cell strings NS11 to NS33 is illustrated to include eight memory cells MC1 to MC8. However, the inventive concept is not limited thereto. In some exemplary embodiments, each of the memory cell strings NS11 to NS33 may include any number of memory cells.

The string selection transistor SST may be connected to corresponding string of selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated.

Figure 11:
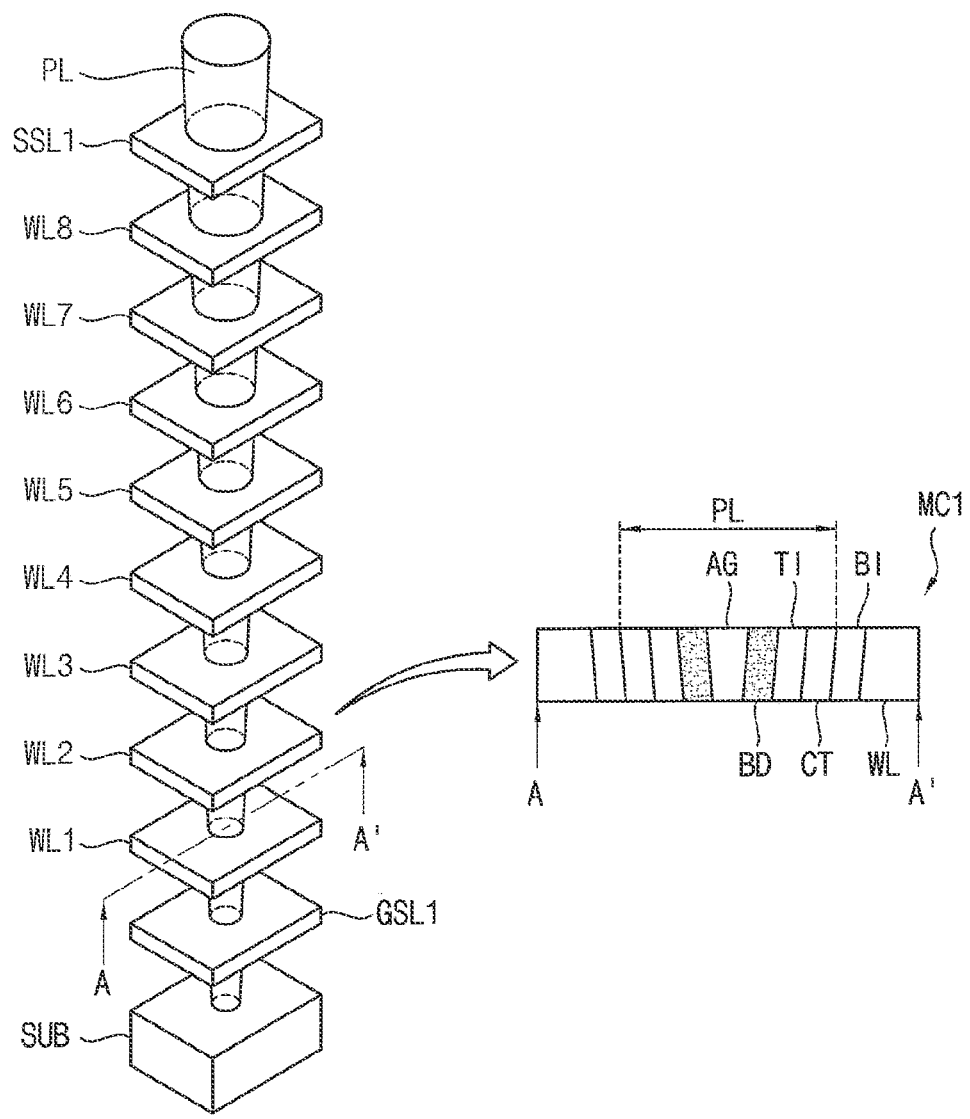
FIG. 11 illustrates an example of a structure of a cell string CS in the memory block of FIG. 10.

FIG. 11 illustrates an example of a structure of a cell string CS in the memory block of FIG. 10.

Referring to FIGS. 10 and 11 a pillar PL is provided on the substrate SUB such that the pillar PL extends in a direction perpendicular to the substrate SUB to make contact with the substrate SUB. Each of the ground selection line GSL, the word-lines WL1 to WL8, and the string selection lines SSL illustrated in FIG. 11 may be formed of a conductive material parallel with the substrate SUB, for example, a metallic material. The pillar PL may be in contact with the substrate SUB through the conductive materials forming the string selection lines SSL, the word-lines WL1 to WL8, and the ground selection line GSL.

A sectional view taken along a line A-A' is also illustrated in FIG. 11. In some exemplary embodiments, a sectional view of a first memory cell MC1 corresponding to a first word-line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure of the first memory cell MC1.

FIG. 12 is a circuit diagram illustrating one of the page buffers in the page buffer circuit in FIG. 6 according to exemplary embodiments.

Referring to FIG. 12, a page buffer PBa includes a pre-charge circuit 430, a bit-line connection circuit 435, a sense and latch circuit 440, a voltage controller 410 and a multiplexer 420.

The pre-charge circuit 430, the bit-line connection circuit 435, the sense and latch circuit 440 and the voltage controller 410 of the page buffer PBa may operate in response to the page buffer control signal PBCTL of the control circuit 210. The page buffer control signal PBCTL may include a load signal LOAD, a bit-line set-up signal BLSTP, a bit-line shut-off signal BLSHF, a bit-line selection signal BLSLT, a refresh signal RFR, a voltage control signal VCTL, and so on.

The pre-charge circuit 430 may supply a pre-charge voltage (or, a power supply voltage) VDD to a sensing node SO. The pre-charge circuit 430 may include a first p-channel metal-oxide semiconductor (PMOS) transistor 431 and a second PMOS transistor 432 which are connected in series between the pre-charge voltage VDD and the sensing node SO. The first PMOS transistor 431 is turned on or off in response to the load signal LOAD and the second PMOS transistor 432 is turned on or off in response to the bit-line set-up signal BLSTP.

The bit-line connection circuit 435 may include first through n-channel metal-oxide semiconductor (NMOS) transistors M11, M12 and M13.

The first NMOS transistor M11 is coupled between an internal node NH and the sensing node SO and has a gate to receive the bit-line shut-off signal BLSHF. The second NMOS transistor M12 is coupled between a bit-line node BN1 and the internal node NH and has a gate to receive the bit-line selection signal BLSLT.

The third NMOS transistor M13 is coupled between the internal node NH and a voltage terminal 437 to receive the first voltage V1 and has a gate to receive a shield signal SHLD.

When nonvolatile memory cells in the memory cell array 100 are connected to the bit-line node BN1 through a bit-line, the third NMOS transistor M13 is used to initialize or discharge a voltage level of the bit-line. Therefore, the third NMOS transistor M13 is in off state for determining on-state or off-stage of the nonvolatile memory cells when the nonvolatile memory cells in the memory cell array 100 are connected to the bit-line node BN1 through a bit-line.

When nonvolatile memory cells in the memory cell array 100 are not connected to the bit-line node BN1 through a bit-line (that is, when the nonvolatile memory cells are not stacked on the second semiconductor layer L2), the bit-line node BN1 is in a floating state, which is the same state in which memory cells having off-state are connected to the bit-line node BN1.

According to a method of testing the nonvolatile memory device described with reference to FIGS. 2 through 5, when the third NMOS transistor M13 is turned-on in response to the shield signal SHLD, a conducting path is provided between the internal node NH and the voltage terminal 437 to receive the first voltage V1 and on state of memory cells may be mimicked even though memory cells are not connected to the page buffer PBa. That is, a voltage level at the sensing node SO may be discharged to the voltage terminal 437 through the first NMOS transistor M11, the internal node NH and the third NMOS transistor M13.

The sense and latch circuit 440 may detect a voltage level of the sensing node SO. Data may be latched according to the detected voltage level of the sensing node SO. The sense and latch 440 may include a latch 441 and NMOS transistors MT1~MT4.

The latch 440 includes inverters INV11 and INV12. The NMOS transistors MT1 and MT3 are coupled between a first node N11 and a ground voltage and the NMOS transistors MT2 and MT4 are coupled between a second node N12 and the ground voltage.

The NMOS transistor MT1 includes a gate receiving a set signal SET, the NMOS transistor MT2 includes a gate receiving a reset signal RST, the NMOS transistor MT3 includes a gate receiving the refresh signal RFR, and the NMO transistor MT4 includes a gate coupled to the sensing node SO. The sense and latch circuit 440 may operate responsive to control signals SET, RST and RFR included in the page buffer control signal PBC.

The voltage controller 410 may generate a selection signal SS1, a second voltage V2 greater than a ground voltage VSS and the shield signal SHLD in response to the voltage control signal VCTL. The voltage controller 410 may provide the selection signal SS1 to a control terminal of the multiplexer 420, may provide the second voltage V2 to a first input terminal of the multiplexer 420 and may provide the shield signal SHLD to the gate of the third NMOS transistor M13. The voltage controller 410 may activate the shield signal SHLD during a first time interval and may provide the activated shield signal SHLD to the gate of the third NMOS transistor M13 during the first time interval. The voltage controller 410 may adjust at least one of the first time interval and the activating level of the shield signal SHLD.

The multiplexer 420 may include a first input terminal to receive the second voltage V2, a second input terminal connected to the ground voltage VSS and a control terminal to receive the selection signal SS1 and may provide the voltage terminal 437 with one of the second voltage V2 and the ground voltage VSS as the first voltage V1, in response to the selection signal SS1.

When the third NMOS transistor M13 is turned-on during the first time interval in response to the shield signal SHLD while the test is performed on the page buffer PBa, the first voltage V1 is provided to the internal node NI1 during the first time interval, and the page buffer PBa may mimic the on-state as described above.

Figure 13:
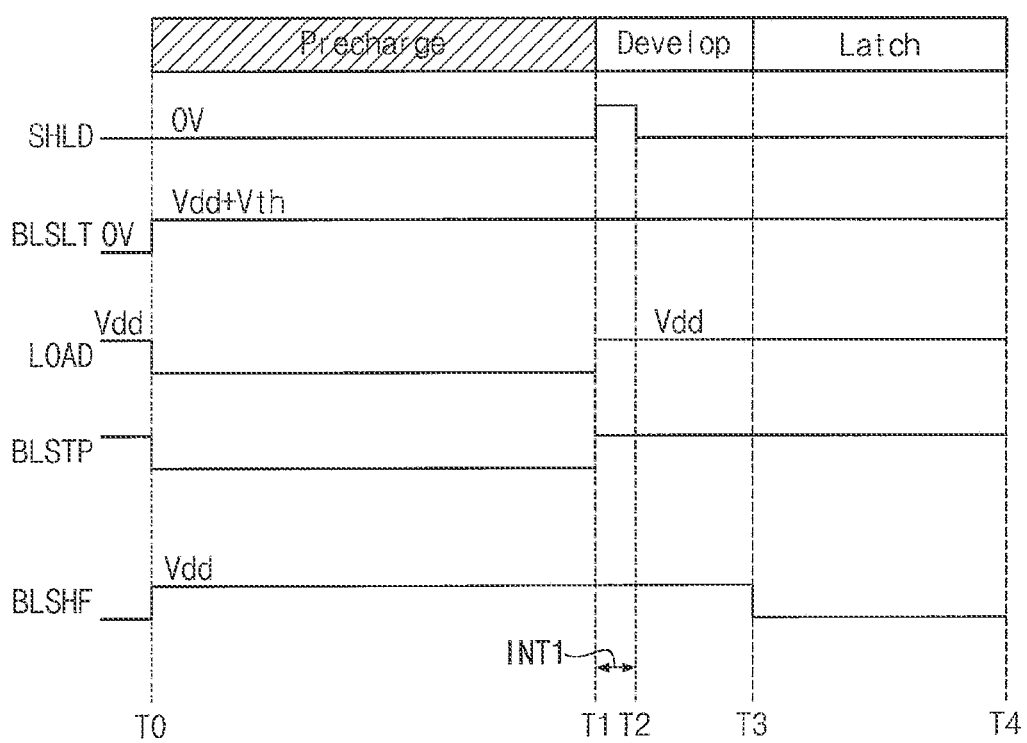
FIG. 13 is a timing diagram of operation of the page buffer during test according to exemplary embodiments.

FIG. 13 is a timing diagram of operation of the page buffer during test according to exemplary embodiments.

FIG. 13 may correspond to the a sensing and latching operation in FIG. 3.

Referring to FIGS. 12 and 13, from a time point T0 to a time point T1, a pre-charge operation may be performed. The sensing node SO is charged for a pre-charge operation. When the shield signal SHLD is deactivated, and bit-line selection signal BLSLT, the load signal LOAD and the bit-line set-up signal BLSTP are activated, the sensing node SO is pre-charged to a specific level.

At time point T1, when the load signal LOAD and the bit-line set-up signal BLSTP are deactivated with a high level, the PMOS transistors 431 and 432 in the pre-charge circuit 430 may be turned off, and thus a current supply from the power supply voltage VDD to the sensing node SO may be interrupted. In addition, when the shield signal SHLD is activated to a high level during a first time interval INT1 from the time point T1 to a time point T2, the first voltage V1 is provided to the internal node NI1.

A voltage level of the sensing node SO changes depending on a voltage level of the internal node NI1 and the voltage level of the sensing node SO may drop quickly until a time point T3 because an on-state of the memory cells is mimicked.

If the shield signal SHLD has a low level during the first time interval INT1 from the time point T1 to the time point T2, the bit-line node BN1 is in a floating state and thus, the voltage level of the sensing node SO may be maintained at a specific level until time point T3

The bit-line shut-off signal BLSHF is maintained at a high level between time points T1 and T3 to connect the sensing node SO to the internal node NI1 and is maintained at a low level between time points T3 and T4 such that a logic level of the sensing node SO is latched in the latch 441.

A testing method with reference to FIGS. 2 through 5 may be sequentially performed on a plurality of page buffers such as the page buffer PBa of FIG. 12.

FIG. 14 is a schematic diagram of a connection of the memory cell array to the page buffer circuit in FIG. 6, according to exemplary embodiments.

Referring to FIG. 14, the memory cell array 100 may include first through (n+1)th NAND strings NS0 through NSn, each of the first through (n+1)th NAND strings NS0 through NSn may include a ground select transistor GST connected to the ground select line GSL, a plurality of memory cells MC respectively connected to the first through (m+1)th word-lines WL0 through WLm, and a string select transistor SST connected to the string select line SSL, and the ground select transistor GST, the plurality of memory cells MC, and the string select transistor SST may be connected to each other in series. In this case, m may be a positive integer.

The page buffer circuit 210 may include first through (n+1)th page buffer units PBU0 through PBUn. The first page buffer unit PB0 may be connected to the first NAND string NS0 via the first bit-line BL0, and the (n+1)th page buffer unit PBUn may be connected to the (n+1)th NAND string NSn via the (n+1)th bit-line BLn. In this case, n may be a positive integer. For example, n may be 7, and the page buffer circuit 210 may have a structure in which page buffer units of eight stages, or, the first through (n+1)th page buffer units PBU0 through PBUn are in a line. For example, the first through (n+1)th page buffer units PBU0 through PBUn may be in a row in an extension direction of the first through (n+1)th bit-lines BL0 through BLn.

The page buffer circuit 210 may further include first through (n+1)th cache latches CL0 through CLn respectively corresponding to the first through (n+1)th page buffer units PBU0 through PBUn. For example, the page buffer circuit 210 may have a structure in which the cache latches of eight stages or the first through (n+1)th cache latches CL0 through CLn in a line. For example, the first through (n+1)th cache latches CL0 through CLn may be in a row in an extension direction of the first through (n+1)th bit-lines BL0 through BLn.

The sensing nodes of each of the first through (n+1)th page buffer units PBU0 through PBUn may be commonly connected to a combined sensing node SOC. In addition, the first through (n+1)th cache latches CL0 through CLn may be commonly connected to the combined sensing node SOC. Accordingly, the first through (n+1)th page buffer units PBU0 through PBUn may be connected to the first through (n+1)th cache latches CL0 through CLn via the combined sensing node SOC.

Although the memory cell array 100 is illustrated as being connected to the page buffer circuit 210 for convenience of explanation in FIG. 14, a first test is performed on the page buffer circuit 210 with the memory cell array 100 being unconnected to the page buffer circuit 210 and the memory cell array 100 is connected to the page buffer circuit 210 after the first test is performed on the page buffer circuit 210.

Figure 15:
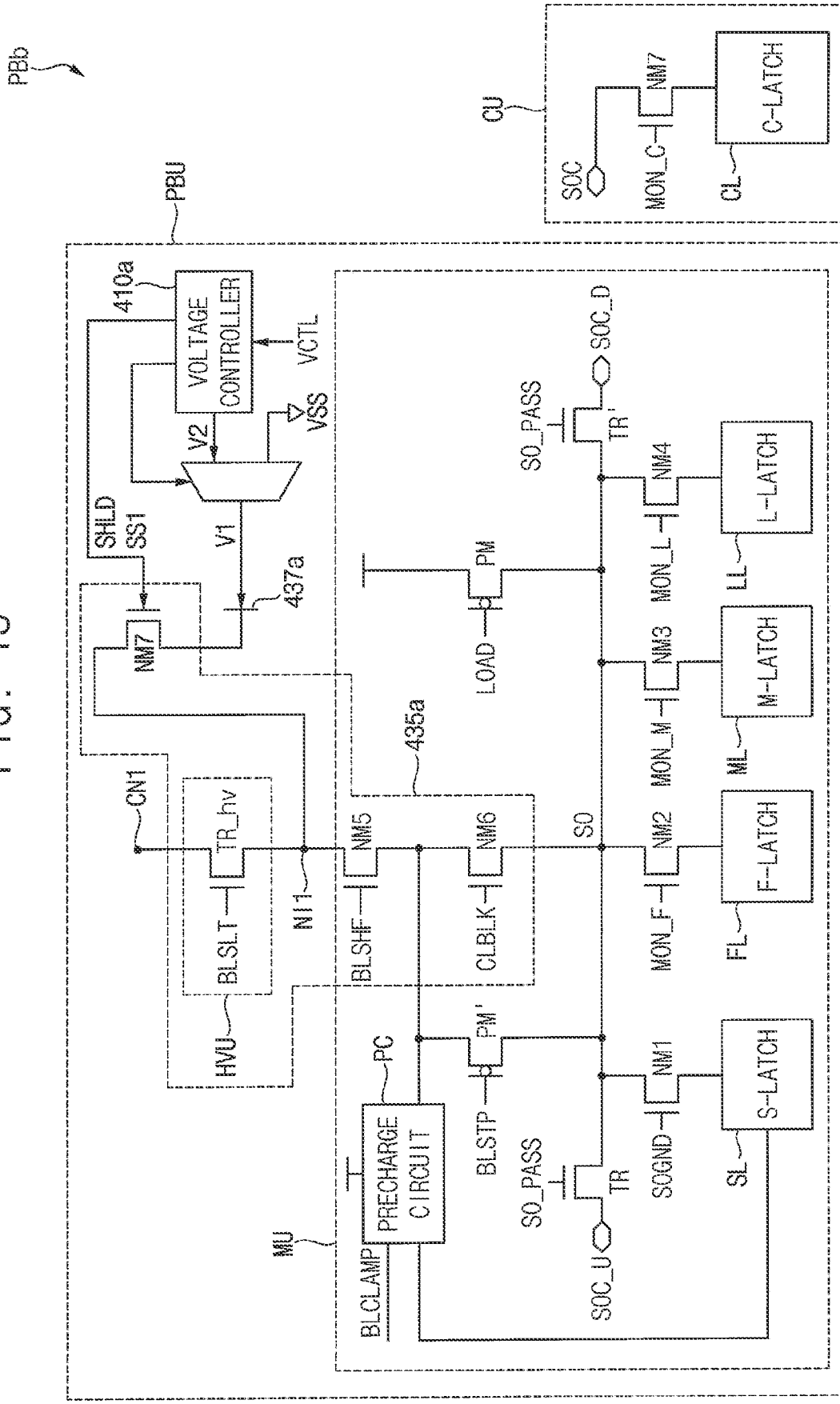
FIG. 15 illustrates in detail a page buffer according to exemplary embodiments.

FIG. 15 illustrates in detail a page buffer according to exemplary embodiments.

Referring to FIG. 15, a page buffer PBb may correspond to an example of the page buffer PB in FIG. 6. The page buffer PBb may include a page buffer unit PBU and a cache unit CU. Because the cache unit CU includes a cache latch (C-LATCH) CL, and the C-LATCH CL is connected to a data input/output line, the cache unit CU may be adjacent to the data input/output line. Accordingly, the page buffer unit PBU and the cache unit CU may be apart from each other, and the page buffer PB may have a structure in which the page buffer unit PBU and the cache unit CU are apart from each other.

The page buffer unit PBU may include a main unit MU an NMOS transistor NM7, a voltage controller 410a and a multiplexer 420a. The main unit MU may include main transistors in the page buffer PB. The page buffer unit PBU may further include a bit-line selection transistor TR_hv that is connected to the bit-line node BN1 and driven by a bit-line selection signal BLSLT. The bit-line select transistor TR_hv may include a high voltage transistor, and accordingly, the bit-line selection transistor TR_hv may be in a different well region from the main unit MU, that is, in a high voltage unit HVU.

The main unit MU may include a sensing latch (S-LATCH) SL, a force latch (F-LATCH) FL, an upper bit latch (M-LATCH) ML and a lower bit latch (L-LATCH) LL. According to an embodiment, the S-LATCH SL, the F-LATCH FL, the M-LATCH ML, or the L-LATCH LL may be referred to as main latches. The main unit MU may further include a pre-charge circuit PC capable of controlling a pre-charge operation on the bit-line BL or a sensing node SO based on a bit-line clamping control signal BLCLAMP, and may further include a transistor PM' driven by a bit-line setup signal BLSETUP.

The S-LATCH SL may, during a read or program verification operation, store data stored in a memory cell MC or a sensing result of a threshold voltage of the memory cell MC. In addition, the S-LATCH SL may, during a program operation, be used to apply a program bit-line voltage or a program inhibit voltage to the bit-line BL. The F-LATCH FL may be used to improve threshold voltage distribution during a program operation. The F-LATCH FL may store force data. After the force data is initially set to '1', the force data may be converted to '0' when the threshold voltage of the memory cell MC enters a forcing region that has a lower voltage than a target region. By utilizing the force data during a program execution operation, the bit-line voltage may be controlled, and the program threshold voltage distribution may be made narrower.

The M-LATCH ML, the L-LATCH LL, and the C-LATCH CL may be utilized to store data externally input during the program operation, and may be referred to as data latches. When data of 3 bits is programmed in one memory cell MC, the data of 3 bits may be stored in the M-LATCH ML, the L-LATCH LL, and the C-LATCH CL, respectively. Until a program of the memory cell MC is completed, the M-LATCH ML, the L-LATCH LL, and the C-LATCH CL may maintain the stored data. In addition, the C-LATCH CL may receive data read from a memory cell MC during the read operation from the S-LATCH SL, and output the received data to the outside via the data input/output line.

In addition, the main unit MU may further include first through fourth transistors NM1 through NM4. The first transistor NM1 may be connected between the sensing node SO and the S-LATCH SL, and may be driven by a ground control signal SOGND. The second transistor NM2 may be connected between the sensing node SO and the F-LATCH FL, and may be driven by a forcing monitoring signal MON_F. The third transistor NM3 may be connected between the sensing node SO and the M-LATCH ML, and may be driven by a higher bit monitoring signal MON_M. The fourth transistor NM4 may be connected between the sensing node SO and the L-LATCH LL, and may be driven by a lower bit monitoring signal MON_L.

In addition, the main unit MU may further include fifth and sixth transistors NM5 and NM6 connected to each other in series between the bit-line selection transistor TV by and the sensing node SO. The fifth transistor NM5 may be driven by a bit-line shut-off signal BLSHF, and the sixth transistor NM6 may be driven by a bit-line connection control signal CLBLK. In addition, the main unit MU may further include a pre-charge transistor PM. The pre-charge transistor PM may be connected to the sensing node SO, driven by a load signal LOAD, and pre-charge the sensing node SO to a pre-charge level in a pre-charge operation period.

In an embodiment, the main unit MU may further include a pair of pass transistors connected to the sensing node SO, or first and second pass transistors TR and TR'. According to an embodiment, the first and second pass transistors TR and TR may also be referred to as first and second sensing node connection transistors, respectively. The first and second pass transistors TR and TR may be driven in response to a pass control signal SO_PASS. According to an embodiment, the pass control signal SO_PASS may be referred to as a sensing node connection control signal. The first pass transistor TR may be connected between a first terminal SOC_U and the sensing node SO, and the second pass transistor TR may be between the sensing node SO and a second terminal SOC_D.

For example, when the page buffer unit PBU corresponds to the second page buffer unit PBU1 in FIG. 14, the first terminal SOC_U may be connected to one end of the pass transistor included in the first page buffer unit PBU0, and the second terminal SOC_D may be connected to one end of the pass transistor included in the third page buffer unit PBU2. In this manner, the sensing node SO may be electrically connected to the combined sensing node SOC via pass transistors included in each of the third through (n+1)th page buffer units PBU2 through PBUn.

During the program operation, the page buffer PB may verify whether the program is completed in a memory cell MC selected among the memory cells MC included in the NAND string connected to the bit-line BL. The page buffer PB may store data sensed via the bit-line BL during the program verify operation in the S-LATCH SL. The M-LATCH ML and the L-LATCH LL may be set in which target data is stored according to the sensed data stored in the S-LATCH SL. For example, when the sensed data indicates that the program is completed, the M-LATCH ML and the L-LATCH LL may be switched to a program inhibit setup for the selected memory cell MC in a subsequent program loop. The C-LATCH CL may temporarily store input data provided from the outside. During the program operation, the target data to be stored in the C-LATCH CL may be stored in the M-LATCH ML and the L-LATCH LL.

The voltage controller 410a may generate a selection signal SS1, a second voltage V2 greater than a ground voltage VSS and the shield signal SHLD in response to the voltage control signal VCTL. The voltage controller 410a may provide the selection signal SS1 to a control terminal of the multiplexer 420a, may provide the second voltage V2 to a first input terminal of the multiplexer 420a and may provide the shield signal SHLD to the gate of the transistor MN7. The voltage controller 410a may activate the shield signal SHLD during a first time interval and may provide the activated shield signal SHLD to the gate of the transistor NM7 during the first time interval. The voltage controller 410a may adjust at least one of the first time interval and the activating level of the shield signal SHLD.

The multiplexer 420a may include a first input terminal to receive the second voltage V2, a second input terminal connected to the ground voltage VSS and a control terminal to receive the selection signal SS1 and may provide a voltage terminal 437a with one of the second voltage V2 and the ground voltage VSS as the first voltage V1, in response to the selection signal SS1.

When the transistor NM7 is turned-on during the first time interval in response to the shield signal SHLD while a test is performed on the page buffer PBb, the first voltage V1 is provided to the internal node NH during the first time interval and the page buffer PBb may mimic the on-state as described above.

In FIG. 15, the transistor NM5 may be referred to as a first NMOS transistor, the transistor TR_hv may be referred to as a second NMOS transistor, the transistor NM6 may be referred to as a third NMOS transistor and the transistor NM7 may be referred to as a fourth NMOS transistor.

A testing method with reference to FIGS. 2 through 5 may be sequentially performed on a plurality of page buffers such as the page buffer PBb of FIG. 15.

Figure 16:
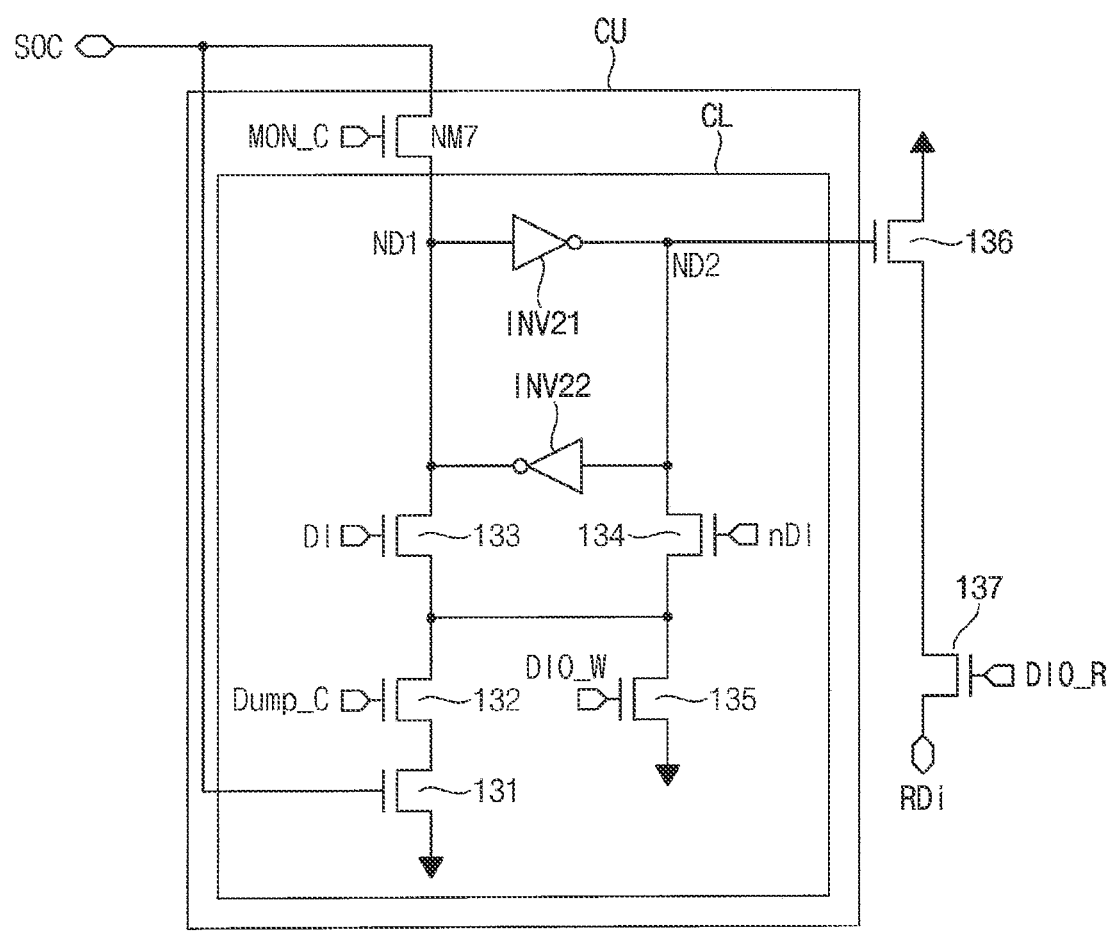
FIG. 16 is a circuit diagram illustrating an example of the cache unit according to exemplary embodiments.

FIG. 16 is a circuit diagram illustrating an example of the cache unit according to exemplary embodiments.

Referring to FIGS. 15 and 16, the cache unit CU may include the monitor transistor NM7 and the C-LATCH CL, the C-LATCH CL may include first and second inverters INV21 and INV22, a dump transistor 132, and transistors 131, 133 to 135. The monitor transistor NM7 may be driven based on the cache monitoring signal MON_C, and may control a connection between the coupling sensing node SOC and the C-LATCH CL.

The first inverter INV21 may be connected between the first node ND1 and the second node ND2, the second inverter INV22 may be connected between the second node ND2 and the first node ND1, and thus, the first and second inverters INV21 and INV22 may form a latch. The transistor 131 may include a gate connected to the combined sensing node SOC. The dump transistor 132 may be driven by a dump signal Dump_C, and may transmit data stored in the C-LATCH CL to a main latch, for example, the S-LATCH SL in the page buffer unit PBU. The transistor 133 may be driven by a data signal DI, a transistor 134 may be driven by a data inversion signal nDI, and the transistor 135 may be driven by a write control signal DIO_W. When the write control signal DIO_W is activated, voltage levels of the first and second nodes ND1 and ND2 may be determined based on the data signal DI and the data inversion signal nDI, respectively.

The cache unit CU may be connected to an data I/O line (or data I/O terminal) RDi via transistors 136 and 137. The transistor 136 may include a gate connected to the second node ND2, and may be turned on or off based on a voltage level of the second node ND2. The transistor 137 may be driven by a read control signal DIO_R. When the read control signal DIO_R is activated and the transistor 137 is turned on, a voltage level of the input/output terminal RDi may be determined as '1' or '0' based on a state of the C-LATCH CL.

Figure 17:
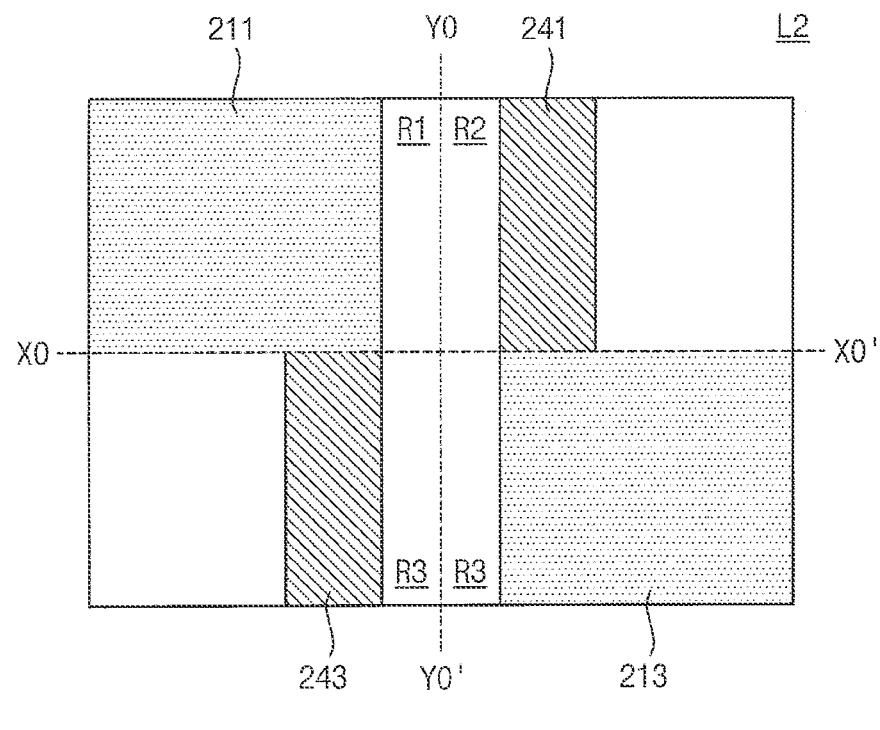
FIG. 17 is a plan view illustrating a top surface of the second semiconductor layer in the nonvolatile memory device of FIG. 8 according to exemplary embodiments.
Figure 18:
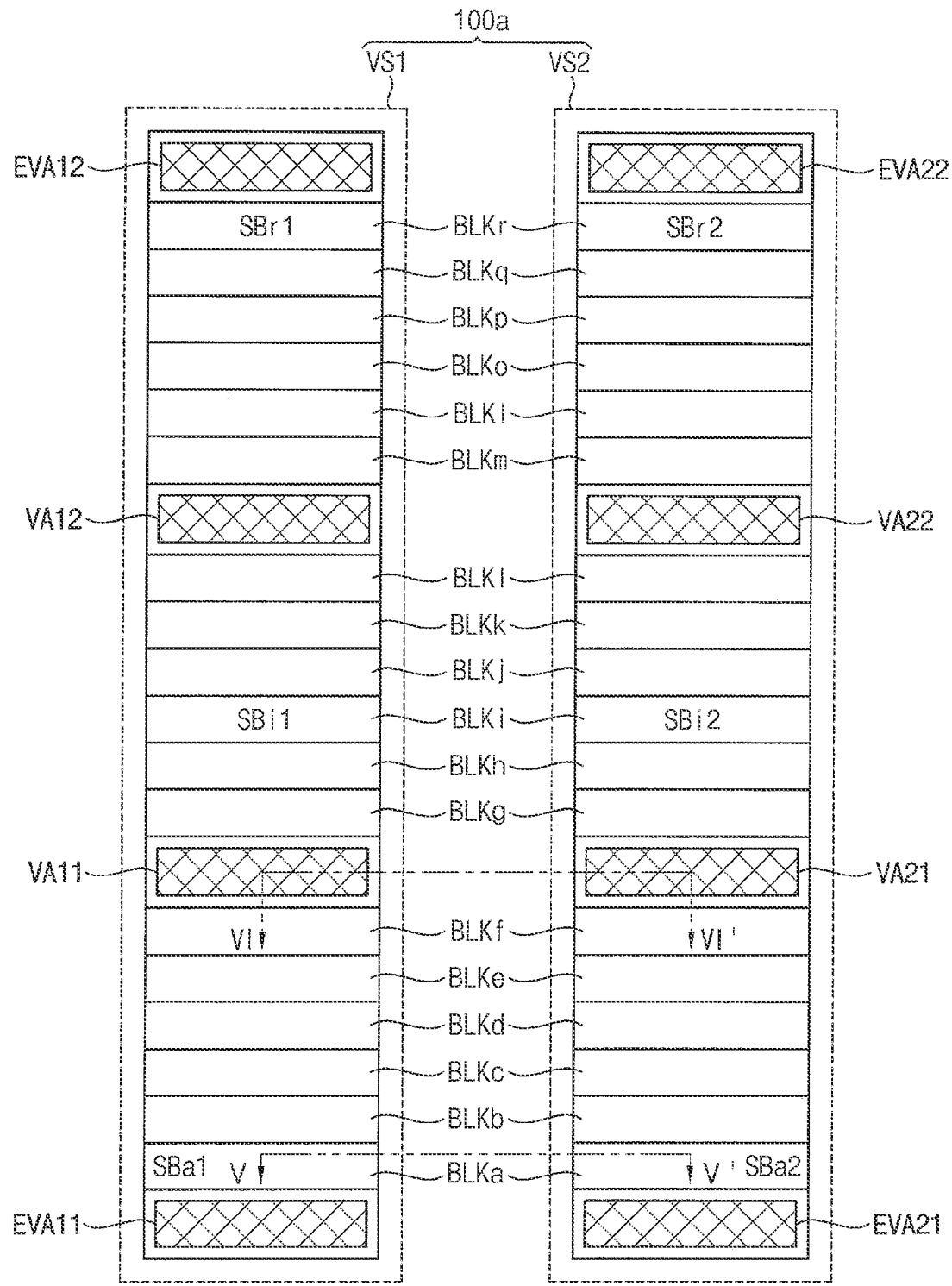
FIG. 18 is a plan view illustrating a top surface of the first semiconductor layer, overlapping the plan view of the FIG. 17.

FIG. 17 is a plan view illustrating a top surface of the second semiconductor layer in the nonvolatile memory device of FIG. 8 according to exemplary embodiments. FIG. 18 is a plan view illustrating a top surface of the first semiconductor layer, overlapping the plan view of the FIG. 17.

Referring to FIGS. 17 and 18, first and second address decoders 241 and 243 may extend in a direction perpendicular to a direction in which the word-lines WL extend. In addition, the first and second page buffer circuits 211 and 213 may extend in a direction perpendicular to the bit-lines BL.

Referring to FIG. 17, the second semiconductor layer L2 may be divided into first through fourth regions R1 through R4 by a first virtual line X0-X0' in the second horizontal direction HD2 parallel to the word-lines WL and a second virtual line Y0-Y0' in the first horizontal direction HD1 parallel to the bit-lines BL.

For example, the first virtual line X0-X0' and the second virtual line Y0-Y0' may overlap the memory cell array 100 located on the first semiconductor layer L1 in the vertical direction VD. In other words, at least a part of each of the first through fourth regions R1 through R4 may overlap the memory cell array 100 located on the first semiconductor layer L1 in the vertical direction VD. The first and second address decoders 241 and 243 may be respectively located in the second and third regions R2 and R3, and the first and second page buffer circuits 211 and 213 may be respectively located in the first and fourth regions R1 and R4.

Referring to FIG. 18, the memory cell array 100 may be located on the first semiconductor layer L1, and the memory cell array 100 may include a first vertical structure VS1 and a second vertical structure VS2. As shown in FIG. 18, the memory cell array 100 may include a plurality of memory blocks BLKa~BLKr formed as the first and second vertical structures VS1 and VS2. The memory blocks BLK1~BLKr may be arranged in the second horizontal direction HD2. Each of the memory blocks BLKa~BLKr may include a first sub-block and a second sub-block. The memory block BLKa includes a first sub-block SBa1 and a second sub-block SBa2. The memory block BLKi includes a first sub-block SBi1 and a second sub-block SBi2. The memory block BLKr includes a first sub-block SBr1 and a second sub-block SBr2.

As shown in FIG. 18, the first vertical structure VS1 may include a plurality of first sub-blocks of the memory blocks BLKa~BLKr and a plurality of first via areas EVA11, VA11, VA12 and EVA12 which are spaced apart in a second direction. In addition, the second vertical structure VS2 may include a plurality of second sub-blocks of the memory blocks BLKa~BLKr and a plurality of second via areas EVA21, VA21, VA22 and EVA22 which are spaced apart in a second direction. The first sub-blocks may be arranged among the first via areas EVA11, VA11, VA12 and EVA12 and the second sub-blocks may be arranged among the second via areas EVA21, VA21, VA22 and EVA22.

For example, in the first via areas VA11 and VA12, one or more first through-hole vias that each pass through the first vertical structure VS1 and are connected to the first page buffer circuit 211 may be formed. In addition, in the second via areas VA21 and VA22, one or more second through-hole vias that each pass through the second vertical structure VS2 and are connected to the second page buffer circuit 213 may be formed. For example, in the first and second edge via areas EVA11 and EVA12, one or more edge through-hole vias that each pass through the first vertical structure VS1 and are connected to the second address decoder 243 may be formed. In addition, in the third and fourth edge via areas EVA21 and EVA22, one or more edge through-hole vias that each pass through the second vertical structure VS22 and are connected to the first address decoder 241 may be formed.

Figure 19:
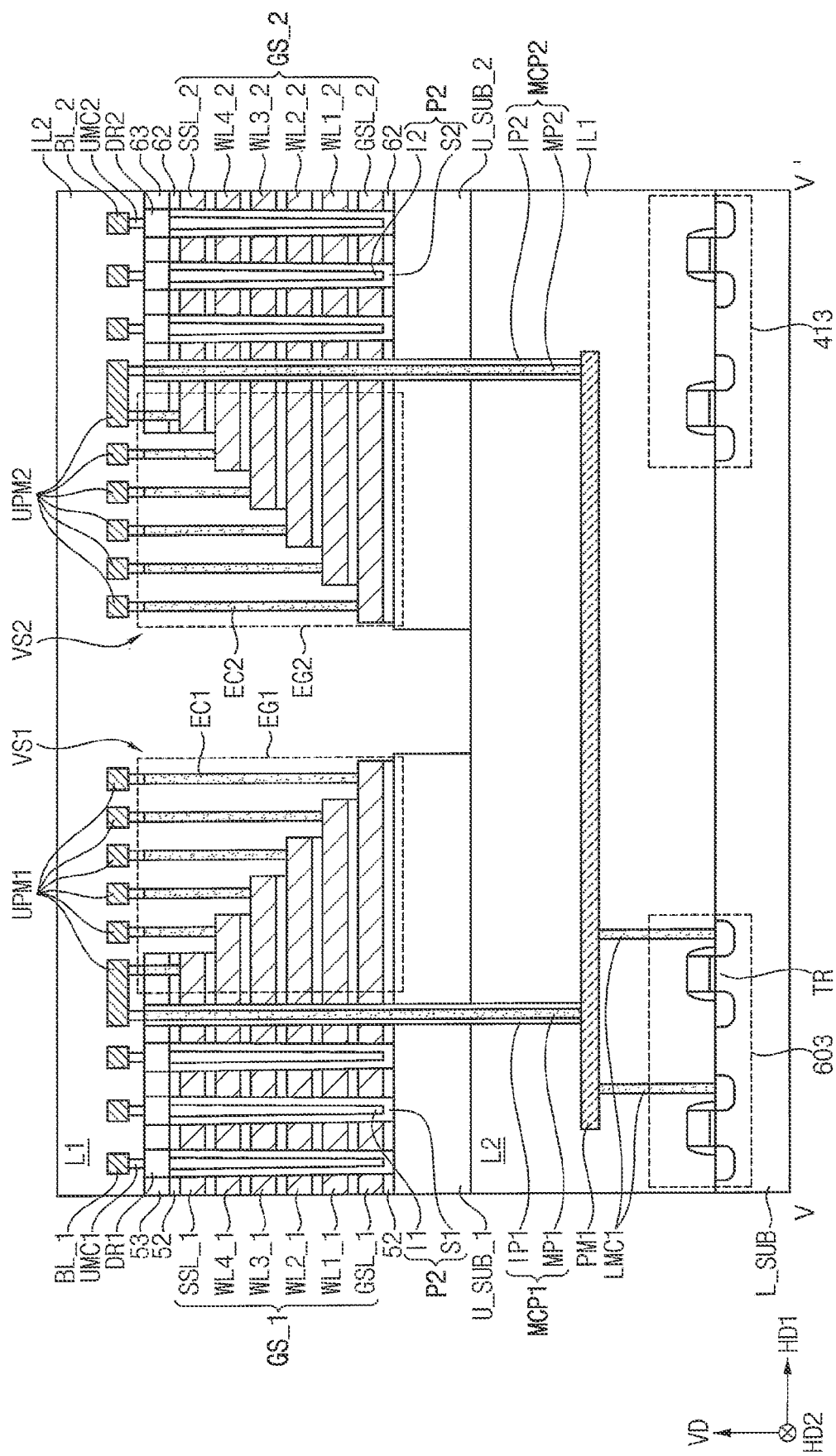
FIG. 19 is a cross-sectional view of the nonvolatile memory device according to exemplary embodiments.

FIG. 19 is a cross-sectional view of the nonvolatile memory device according to exemplary embodiments. For example, FIG. 19 is a cross-sectional view taken along line V-V' of FIG. 18, illustrating configurations of the first and second semiconductor layers.

Referring to FIG. 19, the second semiconductor layer L2 may include a lower substrate L_SUB, and the second address decoder 243 and the second page buffer circuit 213 formed on the lower substrate L_SUB. In addition, the second semiconductor layer L2 may include a plurality of first lower contacts LMC1 electrically connected to the second address decoder 243, a first lower conductive line PM1 electrically connected to the plurality of first lower contacts LMC1, and a lower insulating layer IL1 covering the plurality of first lower contacts LMC1 and the first lower conductive line PM1.

The second address decoder 243 and the second page buffer circuit 213 may be formed on portions of the lower substrate L_SUB. In other words, the second address decoder 243 and/or the second page buffer circuit 213 may be formed by forming a plurality of transistors TR on the lower substrate L_SUB.

The first semiconductor layer L1 may include a first upper substrate U_SUB_1, a second upper substrate U_SUB_2, the first vertical structure VS1 located on the first upper substrate U_SUB_1, and the second vertical structure VS2 located on the second upper substrate U_SUB_2. In addition, the first semiconductor layer L1 may include a plurality of first upper contacts UMC1, a plurality of first bit-lines BL1, a plurality of first edge contacts EC1, and a plurality of first upper conductive lines UPM1 which are electrically connected to the first vertical structure VS1. In addition, the first semiconductor layer L1 may include a plurality of second upper contacts UMC2, a plurality of second bit-lines BL2, a plurality of second edge contacts EC2, and a plurality of second upper conductive lines UPM2 which are electrically connected to the second vertical structure VS2. In addition, the first semiconductor layer L1 may include an upper insulating and passivation layer IL2 covering the first and second vertical structures VS1 and VS2 and various conductive lines.

The first and second upper substrates U_SUB_1 and U_SUB_2 may be support layers that respectively support first and second gate conductive layers GS_1 and GS_2. The first and second upper substrates U_SUB_1 and U_SUB_2 may be, for example, base substrates.

The first vertical structure VS1 may include the first gate conductive layers GS_1 located on the first upper substrate U_SUB_1, and a plurality of pillars P1 that pass through the first gate conductive layers GS_1 and extend in the third direction on a top surface of the first upper substrate U_SUB_1. The first gate conductive layers GS_1 may include a ground selection line GSL_1, word-lines WL1_1 through WL4_1, and a string selection line SSL_1. The ground selection line GSL_1, the word-lines WL1_1 through WL4_1, and the string selection line SSL_1 may be sequentially formed on the first upper substrate U_SUB_1, and an insulating layer 52 may be located under or over each of the first gate conductive layers GS_1. Since the first and second vertical structures VS1 and VS2 have corresponding configurations in the cross-sectional view taken along line V-V', a repeated explanation of elements of the second vertical structure VS2 corresponding to those of the first vertical structure VS1 are be omitted as redundant.

The second vertical structure VS2 may include a plurality of pillars P2 that pass through the second gate conductive layers GS_2. Each of the pillars P2 may include a surface layer S2 and an inside I1. The second gate conductive layers GS_2 may include a ground selection line GSL_2, word lines WL1_2 through WL4_2, and a string selection line SSL_2. An insulating layer 62 may be located under or over each of the second gate conductive layers GS_2.

Each of the plurality of pillars P1 may include a surface layer S1 and an inside I1. For example, the surface layer S1 of each of the pillars P1 may include a silicon material doped with an impurity, or a silicon material not doped with an impurity.

For example, the ground selection line GSL_1 and a portion of the surface layer S1 adjacent to the ground selection line GSL_1 may constitute the ground selection transistor GST (see FIG. 11). In addition, the word-lines WL1_1 through WL4_1 and a portion of the surface layer S1 adjacent to the word-lines WL1_1 through WL4_1 may constitute the memory cell transistors MC1~MC8 (see FIG. 11). In addition, the string selection line SSL_1 and a portion of the surface layer S1 adjacent to the string selection line SSL_1 may constitute the string selection transistor SST (see FIG. 11).

A drain region DR1 may be formed on the pillar P1. A drain region DR2 may be formed on the pillar P2. For example, the drain region DR1 may include a silicon material doped with an impurity. An etch-stop film 53 may be formed on a side wall of the drain region DR1. An etch-stop film 63 may be formed on a side wall of the drain region DR2.

The first vertical structure VS1 may include an edge region EG1. The second vertical structure VS2 may include an edge region EG2. As shown in FIG. 19, a cross-section of the edge region EG1 may form a stepped pad structure. The stepped pad structure may be referred to as a "word line pad". The plurality of first edge contacts EC1 may be connected to the edge region EG1, and an electrical signal may be applied from a peripheral circuit such as the second row decoder 243 through the first edge contacts EC1. For example, a contact plug MCP1 that passes through the first vertical structure VS_1, the first upper substrate U_SUB_1, and a part of the second semiconductor layer L2 may have one side connected to the first lower conductive line PM1 and the other side electrically connected to the edge region EG1 through the first upper conductive lines UPM1.

At least some of the first edge contacts EC1 may pass through parts of the first and second semiconductor layers L1 and L2 in the third direction between the first and second upper substrates U_SUB_1 and U_SUB_2 and may have one side electrically connected to a contact plug connected to the lower conductive line (e.g., PM1).

Figure 20:
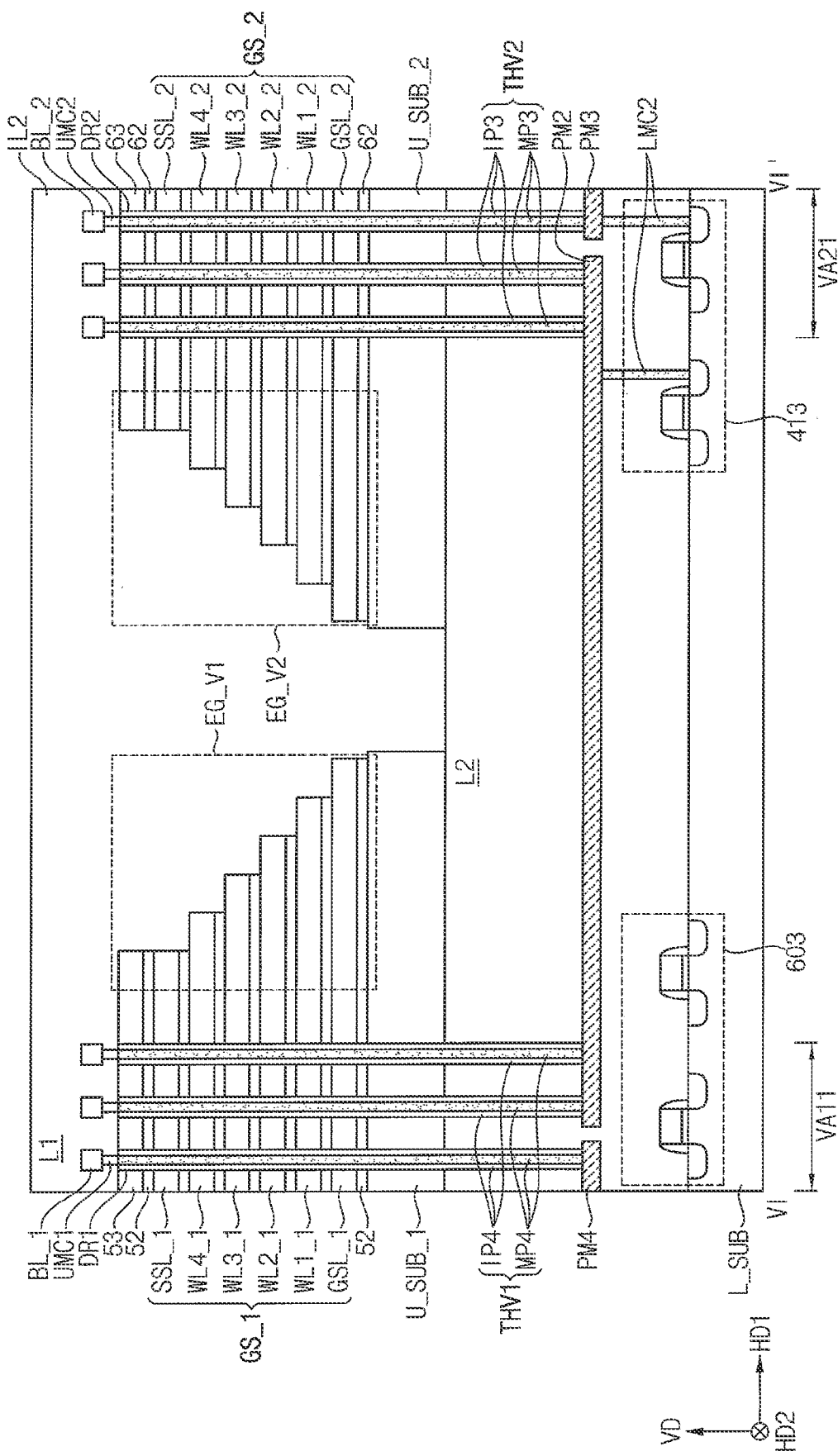
FIG. 20 is a cross-sectional view taken along line VI-VI' of FIG. 18, illustrating configurations of the first and second semiconductor layers.

FIG. 20 is a cross-sectional view taken along line VI-VI' of FIG. 18, illustrating configurations of the first and second semiconductor layers. For example, FIG. 20 may be a cross-sectional view illustrating the second semiconductor layer L2 overlapping the first partial block SB_1 and the via areas VA11 and VA21 provided in the first semiconductor layer L1. A redundant explanation of the same elements of FIG. 19 is omitted for FIG. 20.

Referring to FIG. 20, a plurality of through-hole vias THV1 passing through the first vertical structure VS1, the first upper substrate U_SUB_1, and a part of the second semiconductor layer L2 may be formed in the first via region VA11. Each of the through-hole vias THV1 may include an insulating film pattern IP4 and a conductive pattern MP4. A plurality of through-hole vias THV2 passing through the second vertical structure VS2, the second upper substrate U_SUB_2, and a part of the second semiconductor layer L2 may be formed in the second via region VA21. Each of the through-hole vias THV2 may include an insulating film pattern IP3 and a conductive pattern MP3.

As shown in FIG. 20, each of the through-hole vias THV2 may electrically connect the second page buffer circuit 213 and the second upper contact UMC2 and each of the through-hole vias THV2 may electrically connect the second page buffer circuit 213 and the first upper contact UMC1. The first upper contact UMC1 may be connected to the first bit-line BL1 The second upper contact UMC2 may be connected to the second bit-line BL2. In other words, the first bit-lines BL1 may be electrically connected to the second page buffer circuit 213 formed on the second semiconductor layer L2 through the plurality of through-hole vias THV1 formed in the first via area VA11 and the second bit-lines BL2 may be electrically connected to the second page buffer circuit 213 formed on the second semiconductor layer L2 through the plurality of through-hole vias THV2 formed in the second via area VA21. In exemplary embodiments, conductive patterns such as contacts may omitted at the edge region EG_V1 of the first via area VA11 and at the edge region EG V2 of the second via area VA21.

Figure 21:
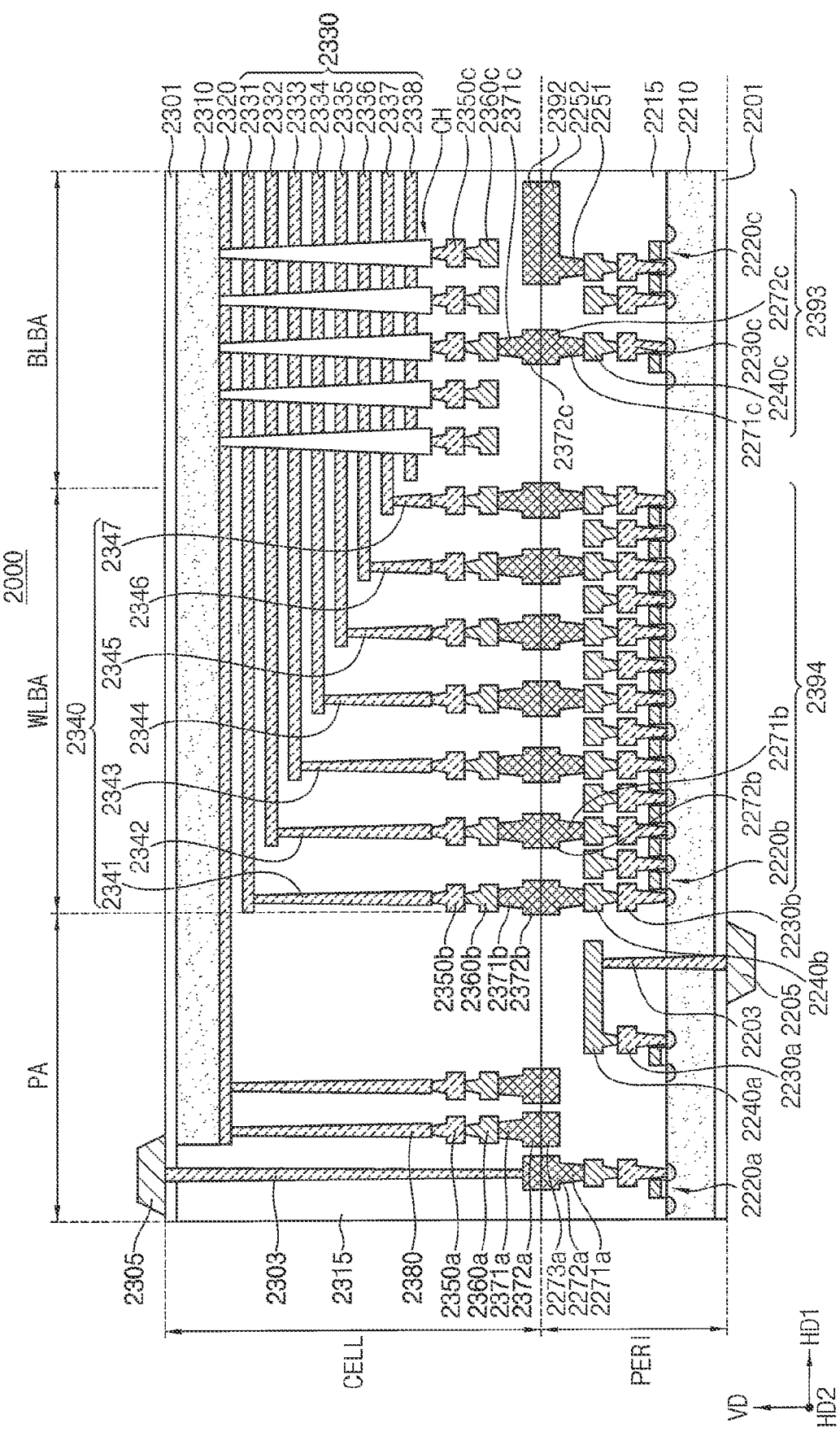
FIG. 21 is a cross-sectional view of a nonvolatile memory device according to exemplary embodiments.

FIG. 21 is a cross-sectional view of a nonvolatile memory device according to exemplary embodiments.

Referring to FIG. 21, a nonvolatile memory device 2000 (the nonvolatile memory device 2000 may be also referred to as a memory device) may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals include copper (Cu) using a Cu-to-Cu bonding. The exemplary embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an exemplary embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an exemplary embodiment illustrated in FIG. 21, although only the first metal layers 2230a, 2230b, and 2230c and the second metal layers 2240a, 2240b, and 2240c are shown and described, the exemplary embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word-lines 2331, 2332, 2333, 2334, 2335, 2336, 2337, and 2338 (i.e., 2330) may be stacked in a vertical direction VD (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction VD, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit-line contact, and the second metal layer 2360c may be a bit-line. In an exemplary embodiment, the bit-line 2360c may extend in a second horizontal direction HD2 (e.g., a Y-axis direction), parallel to the upper surface of the second substrate 2310.

In an exemplary embodiment illustrated in FIG. 21, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first horizontal direction HD1 (e.g., an X-axis direction), parallel to the upper surface of the second substrate 2310 and perpendicular to the second horizontal direction HD2, and may be connected to a plurality of cell contact plugs 2341, 2342, 2343, 2344, 2345, 2346, and 2347 (i.e., 2340). The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming an address decoder 2394 in the peripheral circuit region PERI. In an exemplary embodiment, operating voltages of the circuit elements 2220b forming the address decoder 2394 may be different than operating voltages of the circuit elements 2220c forming the page buffer circuit 2393. For example, operating voltages of the circuit elements 2220c forming the page buffer circuit 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310 and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In the exemplary embodiment, the second input/output pad 2305 is electrically connected to a circuit element 2220a.

According to embodiments, the second substrate 2310 and the common source line 2320 may be absent in an area in which the second input/output contact plug 2303 is disposed. Also, the second input/output pad 2305 may not overlap the word-lines 2330 in the vertical direction HD. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the external pad bonding area PA, the memory device 2000 may include lower bonding metals 2271a and 2271b connected to the lower metal pattern 2273a. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL. Similarly, in the external pad bonding area PA, an upper bonding metal 2371a may be formed and may be electrically connected to the upper metal pattern 2372a.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may be omitted on the upper metal pattern 2392 formed in the uppermost metal layer of the cell region CELL.

In an exemplary embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may be omitted on the reinforcement metal pattern.

The word-line voltages may be applied to at least one memory block in the cell region CELL through the lower bonding metals 2271*b* and 2272*b* in the peripheral circuit region PERI and upper bonding metals 2371*b* and 2372*b* of the cell region CELL. In addition, a page buffer circuit including the page buffer PBa of FIG. 12 or a page buffer circuit including the page buffer PBb of FIG. 15 may be provided in the peripheral circuit region PERI using at least some of the circuit elements 2220*a*, 2220*b* and 2220*c*.

Figure 22:
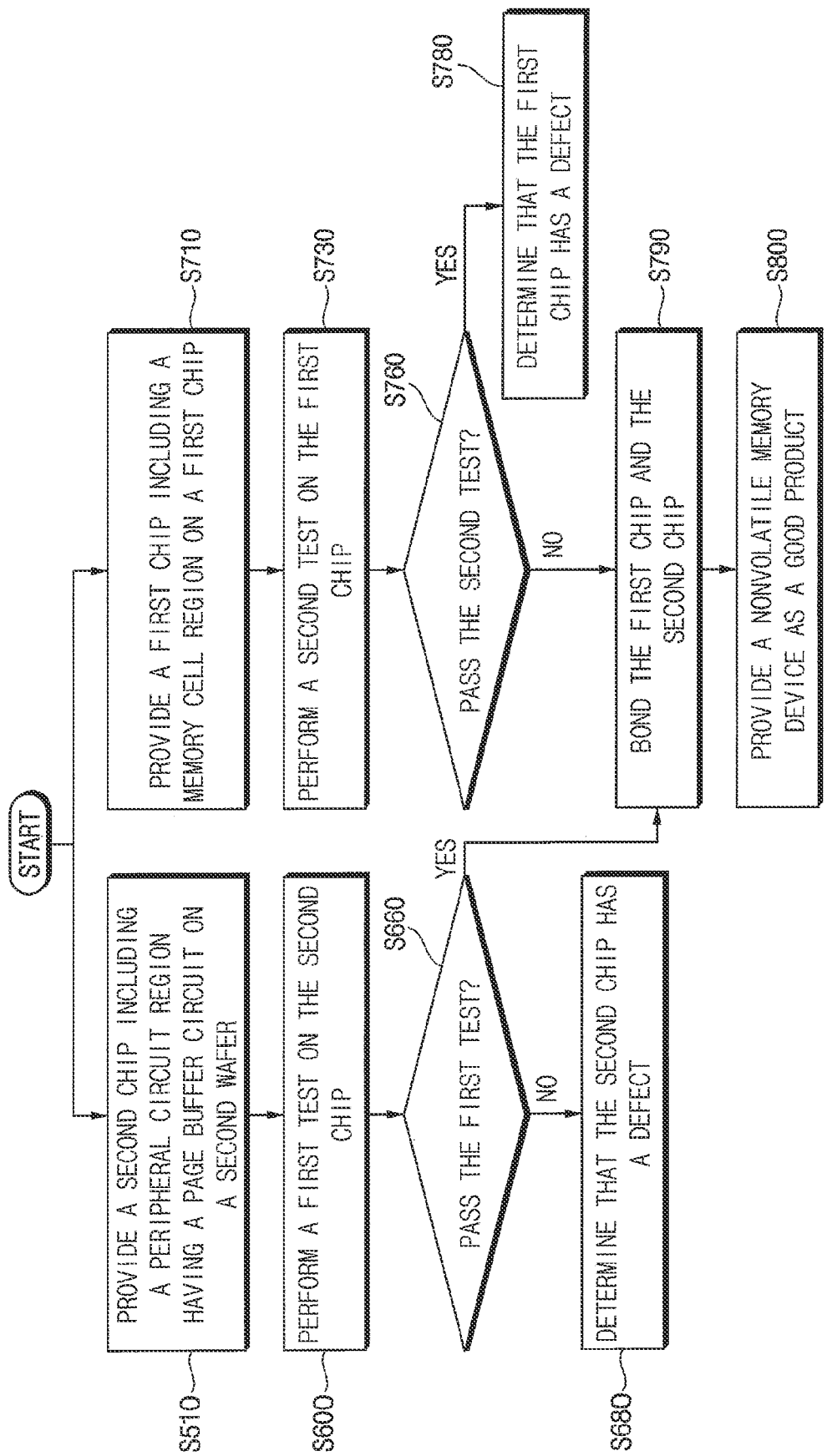
FIG. 22 is a flow chart illustrating a method of manufacturing a non-volatile memory device according to exemplary embodiments.

FIG. 22 is a flow chart illustrating a method of manufacturing a non-volatile memory device according to exemplary embodiments.

The manufacturing method of FIG. 22 may be applied to the manufacturing of the nonvolatile memory device of FIG. 21.

Referring to FIGS. 21 and 22, there is provided a method of manufacturing a nonvolatile memory device 2000 including a first chip and a second chip. The first chip includes a memory cell region CELL and is provided on a first wafer and the second chip includes a peripheral circuit region PERI having a page buffer circuit and is provided on a second wafer different from the first wafer.

According to the method, a second chip including a peripheral circuit region PERI having a page buffer circuit is formed (provided) on the second wafer (operation S510). A first test is performed on the second chip (operation S600). A determination is made as to whether the second chip passes the first test based on a result of the first test (operation S660). When the second chip does not pass the first test (NO in operation S660), the second chip is determined to have a defect (operation S680).

A first chip including a memory cell region CELL is formed (provided) on the first wafer (operation S710) separately from forming and testing the second chip (operation S710). A second test is performed on the first chip (operation S730). A determination is made as to whether the first chip passes the second test based on a result of the second test (operation S760). When the first chip does not pass the second test (NO in operation S760), the first chip is determined to have a defect (operation S780).

When the second chip passes the first test (YES in operation S660) and the first chip does pass the second test (YES in operation S760), the first chip and the second chip are bonded (operation S790) and the nonvolatile memory device 2000 is deemed a viable product (operation S800).

Figure 23:
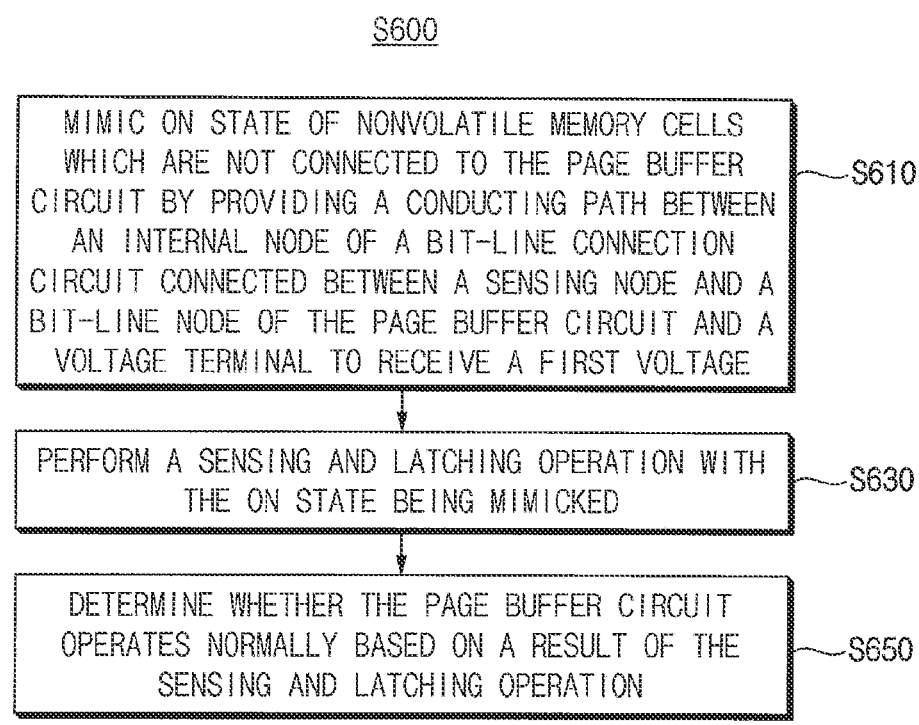
FIG. 23 is a flow chart illustrating operations of a first test on the second chip in FIG. 22 according to exemplary embodiments.

FIG. 23 is a flow chart illustrating operations of a first test on the second chip in FIG. 22 according to exemplary embodiments.

For convenience of explanation, operations of the first test will be explained with reference to FIGS. 12, 21 and 23.

Referring to FIGS. 12, 21 and 23, for performing the first test on the second chip (operation S600), on state of memory cells which are not connected to the page buffer circuit 210 is mimicked by providing a conducting path between an internal node NI1 of a bit-line connection circuit 435 and a voltage terminal 437 to receive a first voltage V1 (operation S610). The bit-line connection circuit 435 is connected between a sensing node SO and a bit-line node BN1 of the page buffer circuit 210 (or a page buffer PB a).

A sensing and latching operation is performed in the page buffer circuit 210, with the on state being mimicked (operation S630). A determination is made as to whether the page buffer circuit 210 operates normally based on a result of the sensing and latching operation (operation S650).

A determination is made as to whether each of other circuit elements operates normally after determining that the page buffer circuit 210 operates normally.

Since a page buffer circuit including the page buffer PBa of FIG. 12 or a page buffer circuit including the page buffer PBb of FIG. 15 may be provided in the peripheral circuit region PERI using at least some of the circuit elements 2220*a*, 2220*b* and 2220*c*, the testing method described with reference to FIGS. 3, 4 and 5 may be applied to FIG. 23.

The test method of FIG. 23 may be concurrently performed on a plurality of second chips on the second wafer.

Figure 24:
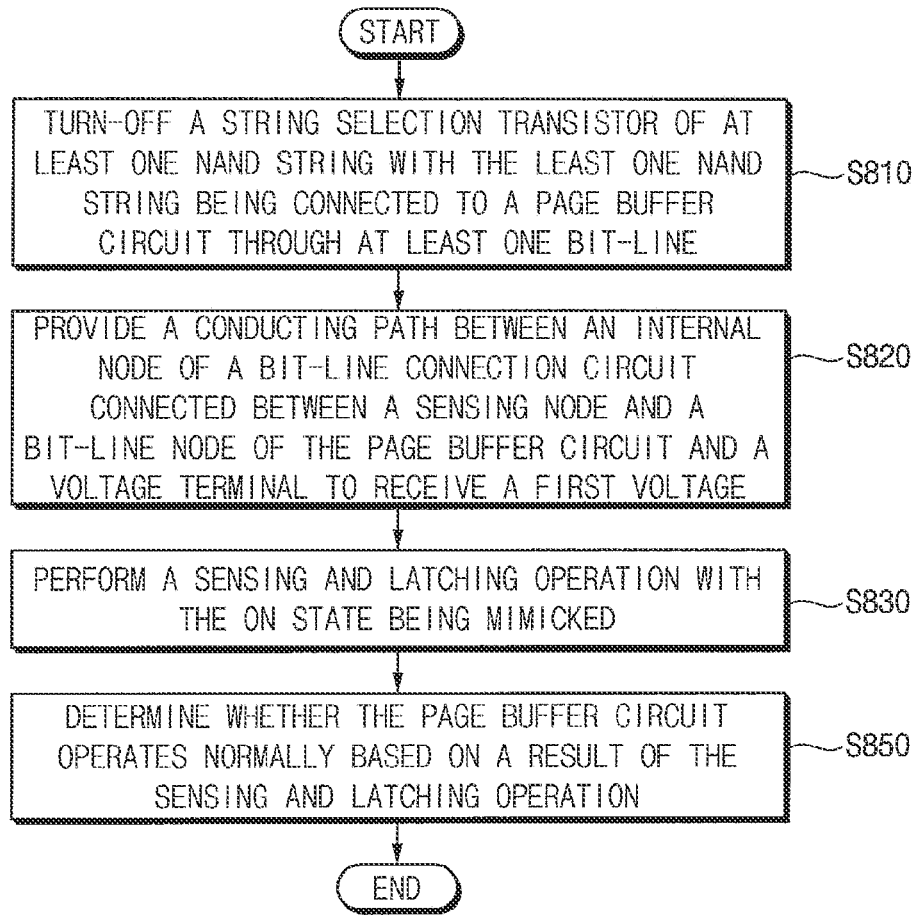
FIG. 24 is a flow chart illustrating a method of testing a nonvolatile memory device according to exemplary embodiments.

FIG. 24 is a flow chart illustrating a method of testing a nonvolatile memory device according to exemplary embodiments.

The testing method of FIG. 24 may be applied to a nonvolatile memory device having the COP structure of FIG. 8, a nonvolatile memory device having a C2C structure of FIG. 21 and a nonvolatile memory device having a vertical structure.

Referring to FIGS. 6, 10, 12 and 24, there is provided a method of testing a nonvolatile memory device 10 including a memory cell array 100 and a page buffer circuit 210 coupled to the memory cell array 100 through a plurality of bit-lines BLs. The memory cell array 100 includes a plurality of nonvolatile memory cells.

According to the method, a string selection transistor SST of at least one NAND string is turned-off with the least one NAND string being connected to the page buffer circuit 210 through at least one bit-line of the plurality of bit-lines (operation S810).

A conducting path is provided between an internal node of a bit-line connection circuit 435 and a voltage terminal 437 to receive a first voltage V1 such that on cells are mimicked with the string selection transistor SST being turned-off (operation S820). The bit-line connection circuit 425 is connected between a sensing node SO and a bit-line node BN1 of the page buffer circuit 210 and the bit-line node BN1 is coupled to the at least one bit-line. A sensing and latching operation is performed in the page buffer circuit 210, with the on state being mimicked (operation S830). A determination is made as to whether the page buffer circuit 210 operates normally based on a result of the sensing and latching operation (operation S850).

When the first semiconductor layer L1 is stacked on the second semiconductor layer L2, the stacking may affect the circuit elements including the page buffer circuit, which are provided in the second semiconductor layer L2. Because the page buffer circuit may operate abnormally due to the faulty stacking, the page buffer circuit may be effectively tested when the page buffer circuit is tested by a method of FIG. 24. In addition, when a nonvolatile memory device does not employ the COP structure of FIG. 8, and when on cells are mimicked by providing a conducting path between an internal node of a bit-line connection circuit and a voltage terminal to receive a first voltage with the string selection transistor being turned-off, the page buffer circuit is tested with the NAND string being disconnected and a defect in the page buffer circuit may be discovered.

Figure 25:
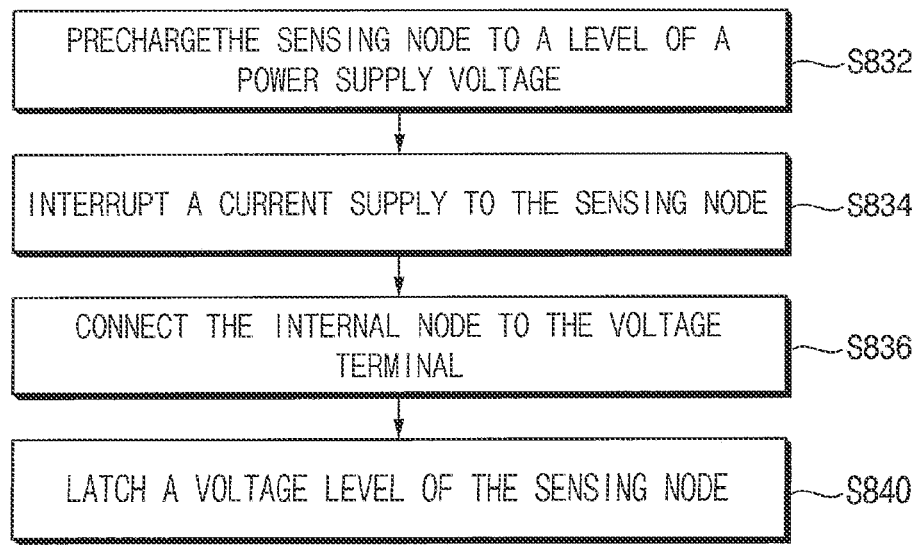
FIG. 25 is a flow chart illustrating detailed operations of performing a sensing and latching operation in FIG. 24 according to exemplary embodiments.

FIG. 25 is a flow chart illustrating detailed operations for performing a sensing and latching operation in FIG. 24 according to exemplary embodiments.

For convenience of explanation, operations for the performing the sensing and latching operation will be explained with reference to FIGS. 12 and 25.

Referring to FIGS. 12 and 25, for performing the sensing and latching operation (S830), the sensing node SO is pre-charged to a level of a power supply voltage VDD (operation S832). A current supply to the sensing node SO is interrupted (operation S834). The internal node NI1 is connected to the voltage terminal 437 receiving the first voltage V1 (operation S836) such that a case in which on-cells are coupled to the bit-line node BN1. The first voltage V1 may correspond to one of a ground voltage VSS and a second voltage V2 greater than the ground voltage VSS. The second voltage V2 may be about 1.0[V]. When the internal node NH is connected to the voltage terminal 437, a conducting path may be provided between the internal node NH and the voltage terminal 437.

A voltage level of the sensing node SO is latched (operation S840) and a determination is made as to whether the page buffer circuit 210 operates normally with the on cells being mimicked.

Figure 26:
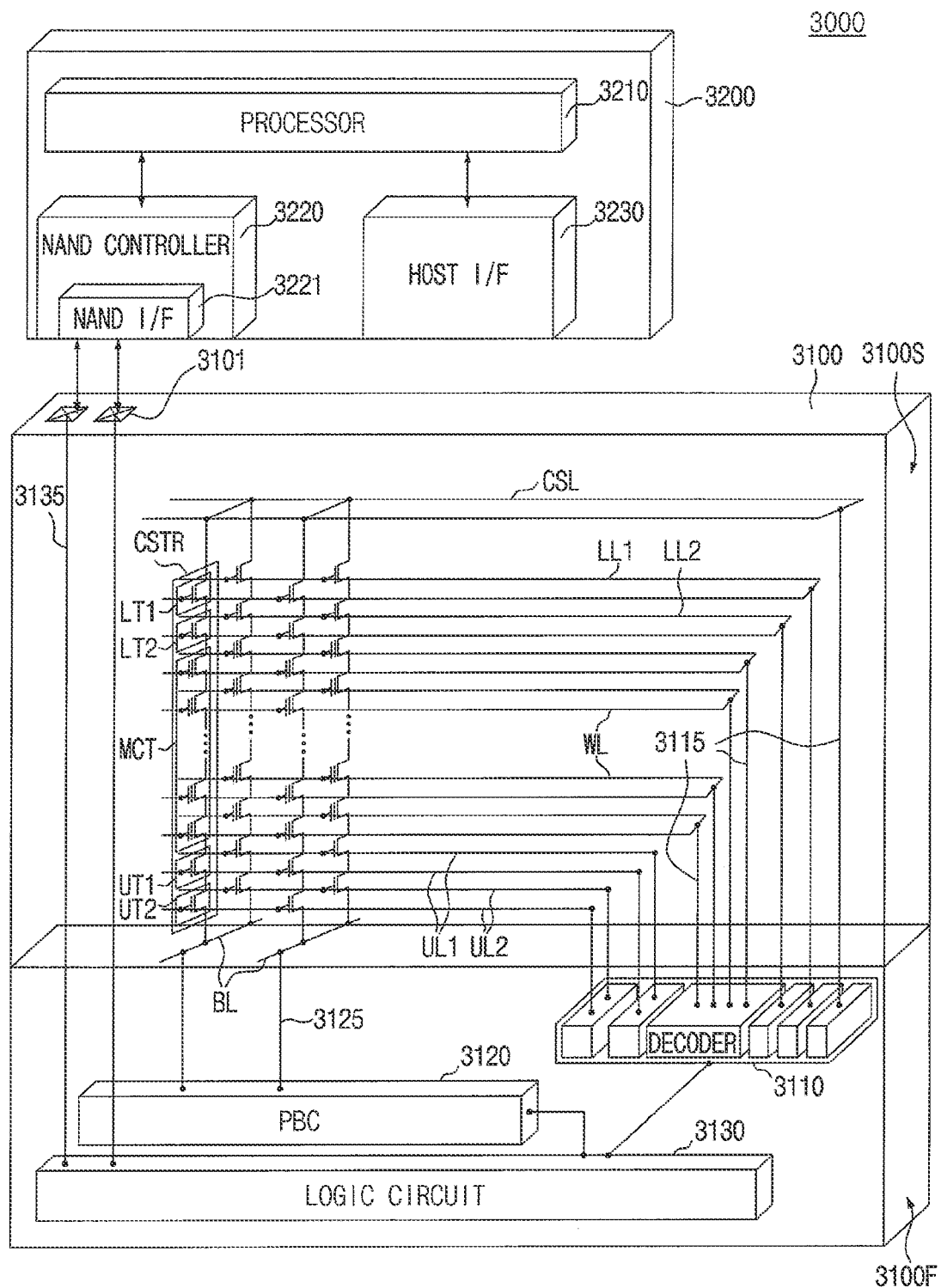
FIG. 26 is a block diagram illustrating an electronic system including a semiconductor device according to exemplary embodiments.

FIG. 26 is a block diagram illustrating an electronic system including a semiconductor device according to exemplary embodiments.

Referring to FIG. 26, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a non-volatile memory device, for example, a NAND flash memory device that will be illustrated with reference to FIGS. 6 to 21. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with exemplary embodiments.

In exemplary embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In exemplary embodiments, the lower transistors LT1 and LT2 may include a lower erase control transistor LT1 and a ground selection transistor LT2 that may be connected with each other in series. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomena.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

A processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

Figure 27:
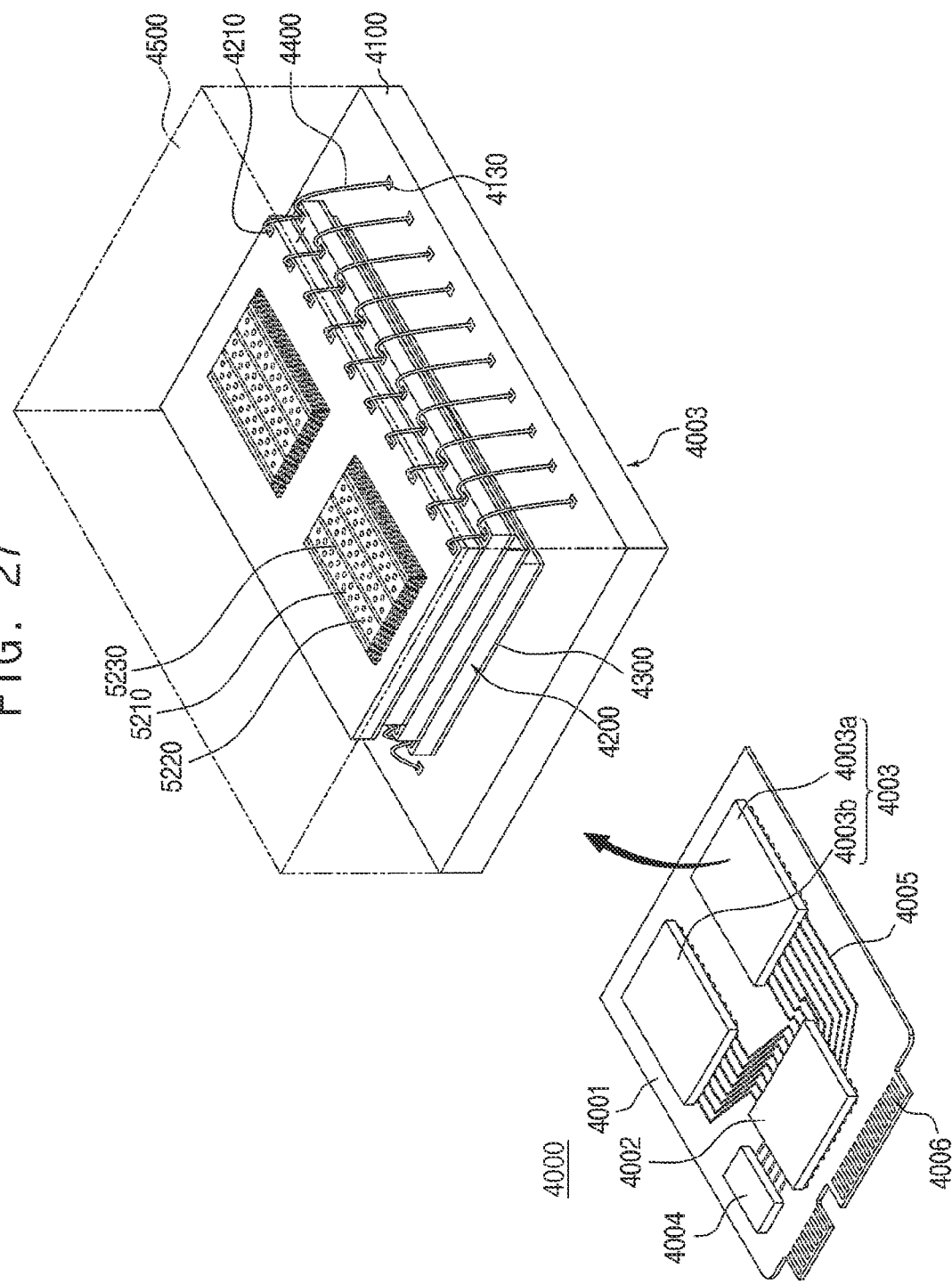
FIG. 27 is a schematic perspective view illustrating an electronic system including a semiconductor device according to exemplary embodiments.

FIG. 27 is a schematic perspective view illustrating an electronic system including a semiconductor device according to exemplary embodiments.

Referring to FIG. 27, an electronic system 4000 may include a main substrate 4001, a controller 4002 mounted on the main substrate 4001, at least one semiconductor package 4003, and a dynamic random access memory (DRAM) device 4004. The semiconductor package 4003 and the DRAM device 4004 may be connected to the controller 4002 by wiring patterns 4005 on the main substrate 4001.

The main substrate 4001 may include a connector 4006 having a plurality of pins connected to an outside host. The number and layout of the plurality pins in the connector 4006 may be changed depending on communication interface between the electronic system 4000 and the outside host. In exemplary embodiments, the electronic system 4000 may communicate with the outside host according to one of a USB, peripheral component interconnect express (PCI-Express), serial advanced technology attachment (SATA), M-PHY for universal flash storage (UFS), etc. In exemplary embodiments, the electronic system 2000 may be operated by power source provided from the outside host through the connector 2006. The electronic system 2000 may further include power management integrated circuit (PMIC) for distributing power provided from an outside host to the controller 4002 and the semiconductor package 4003.

The controller 4002 may write data in the semiconductor package 4003 or read data from the semiconductor package 4003, and may enhance the operational speed of the electronic system 4000.

The DRAM device 4004 may be a buffer memory for reducing the speed difference between the semiconductor package 4003 for storing data and the outside host.

The DRAM device 4004 included in the electronic system 4000 may serve as a cache memory, and may provide a space for temporarily storing data during the control operation for the semiconductor package 4003. If the electronic system 4000 includes the DRAM device 4004, the controller 4002 may further include a DRAM controller for controlling the DRAM device 4004 in addition to the NAND controller for controlling the semiconductor package 4003.

The semiconductor package 4003 may include first and second semiconductor packages 4003a and 4003b spaced apart from each other. The first and second semiconductor packages 4003a and 4003b may be semiconductor packages each of which may include a plurality of semiconductor chips 4200. Each of the first and second semiconductor packages 4003a and 4003b may include a package substrate 4100, the semiconductor chips 4200, bonding layers 4300 disposed under the semiconductor chips 4200, a connection structure 4400 for electrically connecting the semiconductor chips 4200 and the package substrate 4100, and a mold layer 4500 covering the semiconductor chips 4200 and the connection structure 4400 on the package substrate 4100.

The package substrate 4100 may be a printed circuit board (PCB) including package upper pads 4130. Each semiconductor chip 4200 may include an input/output pad 4210. The input/output pad 4210 may correspond to the input/output pad 3101 of FIG. 26. Each semiconductor chip 4200 may include gate electrode structures 5210, memory channel structures 5220 extending through the gate electrode structures 5210, and division structures 5230 for dividing the gate electrode structures 5210. Each semiconductor chip 4200 may include a semiconductor device that is illustrated with reference to FIGS. 6 to 21.

In exemplary embodiments, the connection structure 4400 may be a bonding wire for electrically connecting the input/output pad 4210 and the package upper pads 4130.

A nonvolatile memory device or a storage device according to exemplary embodiments may be packaged using various package types or package configurations.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages offered by the inventive concept. Accordingly, all such modifications are intended to be included within the scope of the inventive concept as defined by the appended claims.

What is claimed is:

1. A method of testing a nonvolatile memory device including a first semiconductor layer and a second semiconductor layer, wherein a plurality of non-volatile memory cells, a plurality of word-lines and a plurality of bit-lines are provided in the first semiconductor layer and the second semiconductor layer is formed prior to the first semiconductor layer, the method comprising:
providing circuit elements including a page buffer circuit in the second semiconductor layer by forming semiconductor elements and patterns for wiring the semiconductor elements in the second semiconductor layer;
mimicking an on state of nonvolatile memory cells which are not connected to the page buffer circuit by providing a conducting path between an internal node of a bit-line connection circuit and a voltage terminal to receive a first voltage, the bit-line connection circuit being connected between a sensing node and a bit-line node of the page buffer circuit;
performing, in the page buffer circuit, a sensing and latching operation with the on state being mimicked; and
determining whether the page buffer circuit operates normally based on a result of the sensing and latching operation.

2. The method of claim 1, wherein performing the sensing and latching operation includes:
pre-charging the sensing node to a level of a power supply voltage;
interrupting a current supply to the sensing node;
connecting the internal node to the voltage terminal; and
latching a voltage level of the sensing node.

3. The method of claim 2, wherein connecting the internal node to the voltage terminal includes:
connecting the internal node to a ground voltage during a first time interval.

4. The method of claim 2, wherein connecting the internal node to the voltage terminal includes:
connecting the internal node to a second voltage greater than a ground voltage during a first time interval.

5. The method of claim 1, wherein the page buffer circuit includes a plurality of page buffers, and
wherein each of the plurality of page buffers includes:
the bit-line connection circuit;
a pre-charge circuit, connected between a power supply voltage and the sensing node, configured to pre-charge the sensing node;
a voltage controller configured to generate a selection signal, a shield signal and a second voltage greater than a ground voltage; and
a multiplexer configured to provide the voltage terminal with one of the ground voltage and the second voltage as the first voltage in response to the selection signal.

6. The method of claim 5, wherein the bit-line connection circuit includes:
a first n-channel metal-oxide semiconductor (NMOS) transistor which is coupled between the internal node and the sensing node and has a gate to receive a bit-line shut-off signal;
a second NMOS transistor which is coupled between the bit-line node and the internal node and has a gate to receive a bit-line selection signal; and
a third NMOS transistor which is coupled between the internal node and the voltage terminal to receive the first voltage and has a gate to receive the shield signal.

7. The method of claim 6, wherein mimicking the on state of memory cells includes:
activating the shield signal during a first time interval to apply the activated shield signal to the gate of the third NMOS transistor.

8. The method of claim 7, further comprising:
adjusting, by the voltage controller, at least one of the first time interval and an activating level of the shield signal.

9. The method of claim 5, further comprising:
activating the shield signal during a first time interval sequentially in each of the plurality of page buffers; and determining whether each of the plurality of page buffers operates normally based on the result of the sensing and latching operation.

10. The method of claim 1, wherein the page buffer circuit includes:
a plurality of page buffer units disposed in a first horizontal direction; and
a plurality of cache latches spaced apart from the plurality of page buffer units in the first horizontal direction, the plurality of cache latches respectively corresponding to the plurality of page buffer units and being commonly connected to a combined sensing node, and
wherein each of the plurality of page buffer units includes a pass transistor connected to each sensing node and driven in response to a pass control signal.

11. The method of claim 10, wherein each of the plurality of page buffer units includes:
a first n-channel metal-oxide semiconductor (NMOS) transistor which is coupled to the internal node and has a gate to receive a bit-line shut-off signal;
a second NMOS transistor which is coupled between the bit-line node and the internal node and has a gate to receive a bit-line selection signal;
a third NMOS transistor which is coupled between the sensing node and the first NMOS transistor and has a gate to receive a connection control signal; and
a fourth NMOS transistor which is coupled between the internal node and the voltage terminal to receive the first voltage and has a gate to receive the shield signal.

12. The method of claim 11, wherein mimicking the on state of memory cells includes:
activating the shield signal during a first time interval to apply the activated shield signal to the gate of the fourth NMOS transistor.

13. The method of claim 12, further comprising:
adjusting, by the voltage controller, at least one of the first time interval and an activating level of the shield signal.

14. A method of testing a nonvolatile memory device including a first chip and a second chip, wherein the first chip includes a memory cell region and is provided on a first wafer and the second chip includes a peripheral circuit region having a page buffer circuit and is provided on a second wafer different from the first wafer, the method comprising:
providing circuit elements including the page buffer circuit by forming semiconductor elements and patterns for wiring the semiconductor elements in a first substrate on the second wafer;
mimicking an on state of memory cells which are not connected to the page buffer circuit by proving a conducting path between an internal node of a bit-line connection circuit and a voltage terminal to receive a first voltage, bit-line connection circuit being connected between a sensing node and a bit-line node of the page buffer circuit;
performing, in the page buffer circuit, a sensing and latching operation with the on state being mimicked; and
determining whether the page buffer circuit operates normally based on a result of the sensing and latching operation.

15. The method of claim 14, wherein performing the sensing and latching operation includes:
pre-charging the sensing node to a level of a power supply voltage;
interrupting a current supply to the sensing node to the sensing node;
connecting the internal node to the voltage terminal; and
latching a voltage level of the sensing node.

16. The method of claim 14, wherein the page buffer circuit includes a plurality of page buffers,
wherein each of the plurality of page buffers includes:
the bit-line connection circuit;
a pre-charge circuit, connected between a power supply voltage and the sensing node, configured to pre-charge the sensing node;
a voltage controller configured to generate a selection signal, a shield signal and a second voltage greater than a ground voltage; and
a multiplexer configured to provide the voltage terminal with one of the ground voltage and the second voltage as the first voltage in response to the selection signal, and
wherein the bit-line connection circuit includes:
a first n-channel metal-oxide semiconductor (NMOS) transistor which is coupled between the internal node and the sensing node and has a gate to receive a bit-line shut-off signal;
a second NMOS transistor which is coupled between the bit-line node and the internal node and has a gate to receive a bit-line selection signal; and
a third NMOS transistor which is coupled between the internal node and the voltage terminal to receive the first voltage and has a gate to receive the shield signal.

17. The method of claim 16, wherein mimicking the on state of memory cells includes:
activating the shield signal during a first time interval to apply the activated shield signal to the gate of the third NMOS transistor.

18. The method of claim 14, wherein the page buffer circuit includes:
a plurality of page buffer units disposed in a first horizontal direction; and
a plurality of cache latches spaced apart from the plurality of page buffer units in the first horizontal direction, the plurality of cache latches respectively corresponding to the plurality of page buffer units and being commonly connected to a combined sensing node, and
wherein each of the plurality of page buffer units includes a pass transistor connected to each sensing node and driven in response to a pass control signal, and
wherein each of the plurality of page buffer units includes:
a first n-channel metal-oxide semiconductor (NMOS) transistor which is coupled to the internal node and has a gate to receive a bit-line shut-off signal;
a second NMOS transistor which is coupled between the bit-line node and the internal node and has a gate to receive a bit-line selection signal;
a third NMOS transistor which is coupled between the sensing node and the first NMOS transistor and has a gate to receive a connection control signal; and
a fourth NMOS transistor which is coupled between the internal node and the voltage terminal to receive the first voltage and has a gate to receive the shield signal.

19. A method of testing a nonvolatile memory device including a memory cell array and a page buffer circuit coupled to the memory cell array through a plurality of bit-lines, wherein the memory cell array includes a plurality of nonvolatile memory cells, the method comprising:
turning-off a string selection transistor of at least one NAND string with the least one NAND string being connected to the page buffer circuit through at least one bit-line of the plurality of bit-lines;

providing a conducting path between an internal node of a bit-line connection circuit and a voltage terminal to receive a first voltage, the bit-line connection circuit being connected between a sensing node and a bit-line node of the page buffer circuit, the bit-line node being coupled to the at least one bit-line;

performing, in the page buffer circuit, a sensing and latching operation; and determining whether the page buffer circuit operates normally based on a result of the sensing and latching operation.

20. The method of claim 19, wherein performing the sensing and latching operation includes:

pre-charging the sensing node to a level of a power supply voltage;

interrupting a current supply to the sensing node to the sensing node;

connecting the internal node to the voltage terminal; and latching a voltage level of the sensing node.

* * * * *